(12) United States Patent
Itoh et al.

(10) Patent No.: US 6,867,455 B2
(45) Date of Patent: Mar. 15, 2005

(54) SEMICONDUCTOR DEVICE WITH A METAL INSULATOR SEMICONDUCTOR TRANSISTOR

(75) Inventors: Yasuyoshi Itoh, Tokyo (JP); Shuuichi Ueno, Tokyo (JP); Haruo Furuta, Tokyo (JP); Natsuo Ajika, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/600,344

(22) Filed: Jun. 23, 2003

(65) Prior Publication Data

US 2004/0026745 A1 Feb. 12, 2004

(30) Foreign Application Priority Data

Jun. 24, 2002 (JP) .......................................... 2002-182441
Jan. 17, 2003 (JP) .......................................... 2003-009516

(51) Int. Cl.$^7$ ............................................. H01L 29/76
(52) U.S. Cl. ................... 257/330; 257/324; 257/327; 257/321; 257/331
(58) Field of Search ................................ 257/314, 315, 257/316, 317, 321, 324, 327, 330, 331, 390, 391, 389, 405, 411, 332, 333

(56) References Cited

U.S. PATENT DOCUMENTS

| 5,768,192 | A |   | 6/1998 | Eitan |         |
|-----------|----|---|--------|-------|---------|
| 6,486,028 | B1 | * | 11/2002| Chang et al. ............... | 438/259 |
| 6,713,834 | B2 | * | 3/2004 | Mori et al. ................. | 257/510 |

FOREIGN PATENT DOCUMENTS

| JP | 5-75133    | 3/1993 |
| JP | 2000-260887| 9/2000 |
| JP | 2002-26149 | 1/2002 |

OTHER PUBLICATIONS

Ilan Bloom, et al., "NROM™—A New Non–Volatile Memory Technology: From Device to Products", Microelectronic Engineering 59, 2001, pp. 213–223.

Toshiyuki Toyoshima, et al., "0.1 $\mu$m Level Contact Hole Pattern Formation with KrF Lithography by Resolution Enhancement Lithography Assisted by Chemical Shrink (RELACS)", IEEE, IEDM, 1998, pp. 333–336.

J. De Blauwe, et al., "Si–Dot Non–Volatile Memory Device", Extended Abstracts of the 2001 International Conference on Solid State Devices and Materials, Tokyo, 2001, pp. 518–519.

Boaz Eitan, et al., "Can NROM, A 2–Bit, Trapping Storage NVM Cell, Give a Real Challenge to Floating Gate Cells?", Presented at the International Conference on Solid State Devices and Materials, Tokyo, 1999, pp. 1/3–3/3.

Eli Lusky, et al., "Electron Discharge Model of Locally–Trapped Charge in Oxide–Nitride–Oxide (ONO) Gates for NROM™ Non–Volatile Semiconductor Memory Devices", Presented at the Solid State Device and Materials Conference (SSDM 2001), Sep. 2001, Tokyo, Japan, pp. 1–2.

* cited by examiner

*Primary Examiner*—Minhloan Tran
*Assistant Examiner*—Tan Tran
(74) *Attorney, Agent, or Firm*—Oblon, Spivak, McClelland, Maier & Neustadt, P.C.

(57) ABSTRACT

A semiconductor device capable of holding multibit information in one memory cell, and a method of manufacturing the semiconductor device. A trench is formed in a channel portion of an MONOS transistor. Then, a source side portion and a drain side portion in a silicon nitride film of a gate insulating film which interpose the trench are caused to function as first and second electric charge holding portions capable of holding electric charges. In the case in which first electric charges are trapped on the drain side and second electric charges are trapped on the source side, a portion of a gate electrode in the trench functions as a shield. If a fixed potential is given to the gate electrode, the second electric charge holding portion is not influenced by an electric field induced by the first electric charges so that the trapping of the second electric charges is not inhibited.

11 Claims, 34 Drawing Sheets

BACKGROUND ART    F I G . 3 9
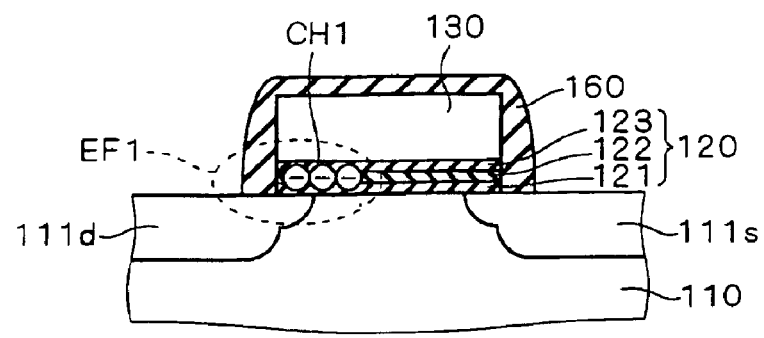
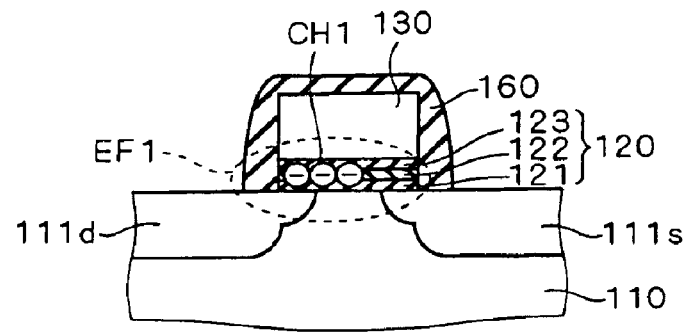

BACKGROUND ART FIG. 40
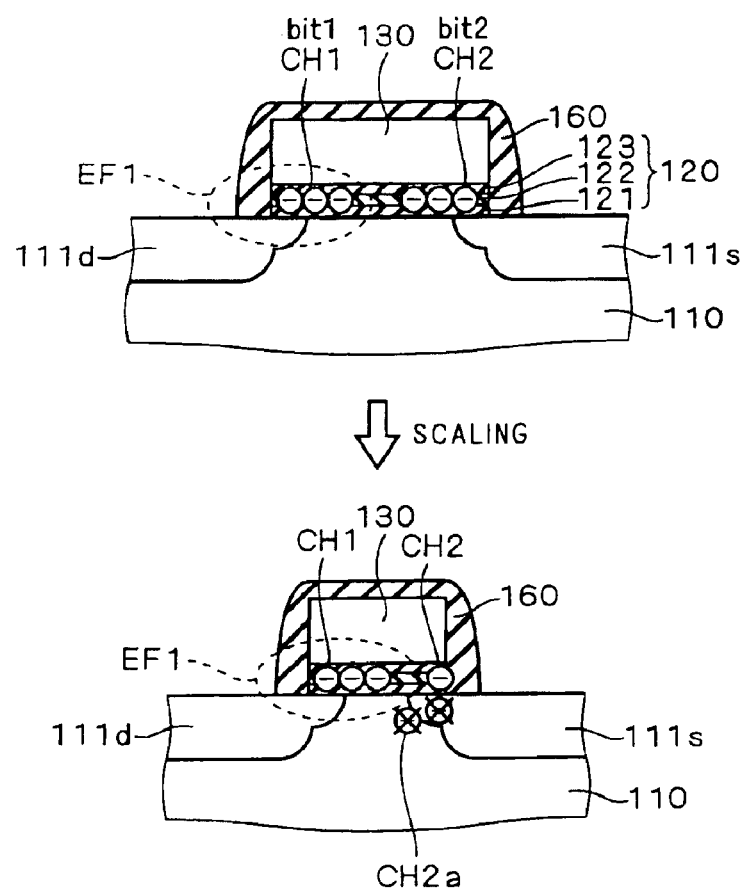

F I G . 4 1
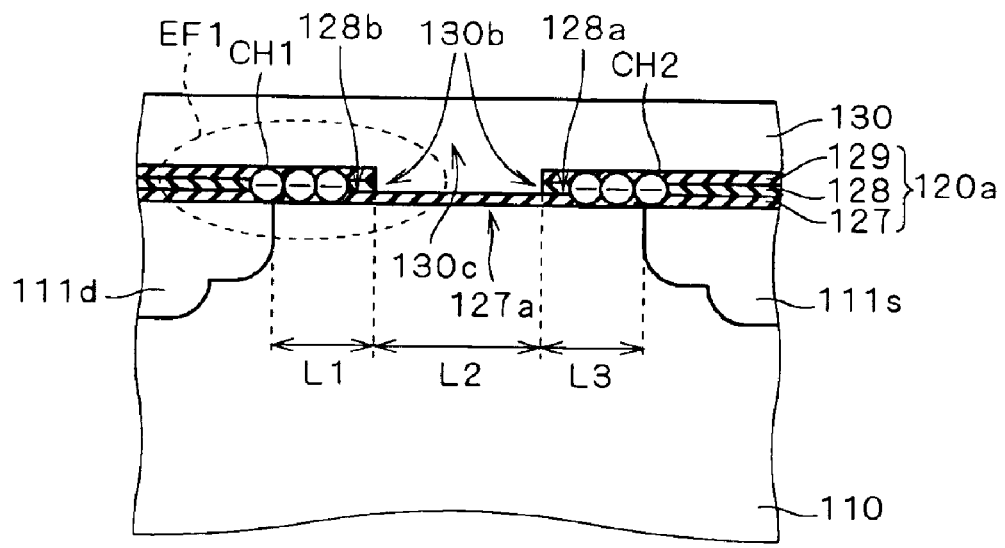
F I G . 4 2
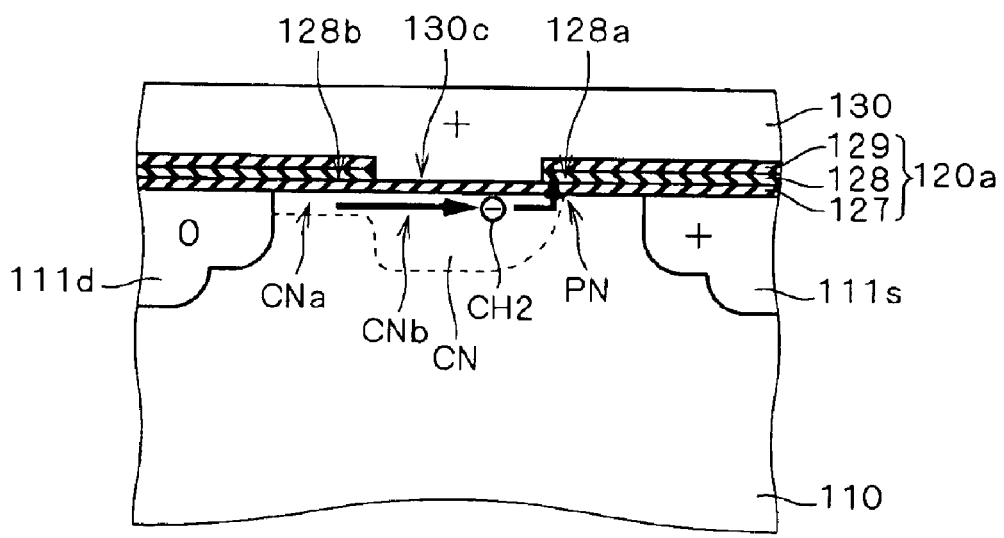

SEMICONDUCTOR DEVICE WITH A METAL INSULATOR SEMICONDUCTOR TRANSISTOR

BACKGROUND OF THE INVENTION

1. Field of the Invention

The present invention relates to a semiconductor device to be utilized for a memory cell of a nonvolatile memory and a method of manufacturing the semiconductor device.

2. Description of the Background Art

Examples of a semiconductor device to be utilized for a memory cell of a nonvolatile memory include an MONOS (Metal Oxide Nitride Oxide Semiconductor) transistor having a structure shown in FIG. 35. The MONOS transistor comprises a source region 111s and a drain region 111d which are formed in a semiconductor substrate 110, a gate insulating film 120 formed on the semiconductor substrate 110, and a gate electrode 130 formed on the gate insulating film 120.

The gate insulating film 120 is a laminated film (an ONO film) in which a silicon oxide film 121, a silicon nitride film 122 and a silicon oxide film 123 are sequentially provided. When the MONOS transistor is to be under a programming (writing) operation as a memory cell, proper voltages are applied to the semiconductor substrate 110, the gate electrode 130, the source region 111s and the drain region 111d, respectively, to trap electric charges CH1 such as electrons into the drain region 111d side in the silicon nitride film 122, for example. On the other hand, also when an erase operation is to be carried out, proper voltages are applied to respective portions to extract the trapped electric charges CH1.

In the case in which the electric charges CH1 are trapped, a change in a threshold voltage of the MONOS transistor is caused in contrast with in the case in which the electric charge CH1 is not trapped. By detecting the change in the threshold voltage, accordingly, it is decided whether 1-bit information is stored in a memory cell or not.

FIG. 36 is a top view showing a nonvolatile memory 101 constituted by a plurality of MONOS transistors illustrated in FIG. 35. In the nonvolatile memory 101, a source/drain region 111 including the source region 111s and the drain region 111d functions as a bit line and the gate electrode 130 functions as a word line. FIG. 35 shows a section of a memory cell CL portion in FIG. 36. The electric charges CH1 are trapped into a data storage region DR in the memory cell CL.

Both of FIGS. 37 and 38 are perspective views showing an example of a more specific structure of the nonvolatile memory 101 illustrated in FIG. 36. In a nonvolatile memory 101A shown in FIG. 37, an isolating region 140 is formed in portions of a source region 111s and a drain region 111d in adjacent memory cells CL. The source region 111s and the drain region 111d provided under the isolating region 140 continue between a plurality of memory cells and function as bit lines. Moreover, a gate insulating film 120 is divided for each memory cell in a direction of a channel length.

On the other hand, a nonvolatile memory 101B in FIG. 38 is not provided with a portion corresponding to the isolating region 140 in FIG. 37. Moreover, a gate insulating film 120 is provided continuously without a division for each memory cell in a direction of a channel length. In both of the nonvolatile memories 101A and 101B in FIGS. 37 and 38, an interlayer insulating film 150 provided on the MONOS transistor is illustrated transparently so as not to obstruct a lower structure thereof.

There are the following information about documents of the prior art related to the present application:

U.S. Pat. No. 5,768,192 specification (which will be hereinafter referred to as Patent Document 1);

Japanese Patent Application Laid-Open No. 2002-26149 (which will be hereinafter referred to as Patent Document 2);

Japanese Patent Application Laid-Open No. 5-75133 (1993) (which will be hereinafter referred to as Patent Document 3);

I. Bloom et al., "NROM anew non-volatile memory technology: from device to products", (U.S.A.), Microelectronic Engineering 59(2001), pp.213–223 (which will be hereinafter referred to as Non-Patent Document 1);

B. Eitan et al., "Can NROM, a 2-bit, Trapping Storage NVM Cell, Give a Real Challenge to Floating Gate Cells?" (U.S.A.), SSDM1999 (which will be hereinafter referred to as Non-Patent Document 2);

E. Lusky et al., "Electron Discharge Model of Locally-Trapped Charge in Oxide-Nitride-Oxide (ONO) Gates for NROM Non-Volatile Semiconductor Memory Devices" (U.S.A.), SSDM2001 (which will be hereinafter referred to as Non-Patent Document 3);

T. Toyoshima et al., "0.1 $\mu$m Level Contact Hole Pattern Formation with KrF Lithography by Resolution Enhancement Lithography Assisted by Chemical Shrink (RELACS)" IEDM1998, p.333 (which will be hereinafter referred to as Non-Patent Document 4); and J. De Blauwe et al., "Si-Dot Non-Volatile Memory Device" (U.S.A.), Extended Abstracts of the 2001 International Conference on Solid State Devices and Materials, Tokyo, 2001, pp.518–519 (which will be hereinafter referred to as Non-Patent Document 5).

As shown in FIG. 39, even if a channel length of an MONOS transistor to be a memory cell of a nonvolatile memory 101 (which has the same structure as that of the MONOS transistor in FIG. 35 and further comprises a sidewall insulating film 160) is reduced according to a progress of scaling (an advance in fineness of an element), an effective range of an electric field EF1 induced by trapped electric charges CH1 is not changed.

In the MONOS transistor, it is possible to trap electric charges into the source region 111s side as well as trapping of the electric charges CH1 into the drain region 111d side in the silicon nitride film 122. If the electric charges are trapped into each of the source/drain sides, one memory cell can hold 2-bit information.

In an MONOS transistor on the upper side of FIG. 40, electric charges are trapped into each of source/drain sides. Electric charges CH1 trapped into the drain region 111d side are indicated as bit1 and electric charges CH2 trapped into the source region 111s side are indicated as bit2.

Also in the case in which the electric charges are to be trapped into both of the source/drain sides, a channel length is reduced by the scaling as shown on the lower side of FIG. 40. In some cases in which the electric charges are to be trapped into each of the source/drain sides, the trapping of the electric charges CH2 is prevented by a repulsion of an electric field EF1 induced by the electric charges CH1 which are first trapped (This phenomenon is indicated as electric charges CH2a in FIG. 40). With a structure of a conventional semiconductor device, therefore, it is harder to hold multibit information in one memory cell when the scaling progresses.

SUMMARY OF THE INVENTION

It is an object of the present invention to provide a semiconductor device capable of holding multibit information in one memory cell also when scaling for a nonvolatile memory progresses, and a method of manufacturing the semiconductor device.

According to a first aspect of the present invention, a semiconductor device includes a semiconductor substrate having a trench on a surface, and an MIS (Metal Insulator Semiconductor) transistor. The MIS transistor includes a source region formed to face the surface in the semiconductor substrate, a drain region formed to face the surface in the semiconductor substrate apart from the source region through the trench, a gate insulating film formed on at least a portion of the surface which is interposed between the source region and the drain region to enter the trench, and a gate electrode formed on the gate insulating film to enter the trench. First and second electric charge holding portions capable of holding an electric charge are formed in the gate insulating film to interpose the trench therebetween.

In the MIS transistor, the gate electrode is formed on the gate insulating film to enter the trench. The first and second electric charge holding portions are formed in the gate insulating film to interpose the trench therebetween. In the case in which an electric charge is trapped into the first electric charge holding portion and another electric charge is then trapped into the second electric charge holding portion, accordingly, the gate electrode in the trench functions as a shield. More specifically, the second electric charge holding portion is not influenced by an electric field induced by the electric charge of the first electric charge holding portion, and the trapping of the electric charge into the second electric charge holding portion is not inhibited even if scaling progresses. If the MIS transistor is applied to a memory cell of a nonvolatile memory, therefore, a semiconductor device capable of holding multibit information in one memory cell can be implemented also when scaling for the nonvolatile memory progresses. Moreover, the trench is formed between the source region and the drain region. Consequently, an effective channel length can be increased and a tolerance to a punch-through can also be enhanced.

According to a second aspect of the present invention, a semiconductor device includes a semiconductor substrate having a surface and an MIS (Metal Insulator Semiconductor) transistor. The MIS transistor includes a source region formed to face the surface in the semiconductor substrate, a drain region formed to face the surface in the semiconductor substrate apart from the source region, a gate insulating film formed on at least a portion of the surface which is interposed between the source region and the drain region, and a gate electrode formed on the gate insulating film. First and second electric charge holding portions capable of holding an electric charge are formed in the gate insulating film opposite to each other in such a direction as to connect the source region and the drain region apart from each other. A thickness of a portion of the gate insulating film which is interposed between the first and second electric charge holding portions is smaller than that of each of portions in which the first and second electric charge holding portions are formed. The gate electrode is provided between the first and second electric charge holding portions.

In the MIS transistor, the thickness of the portion of the gate insulating film which is interposed between the first and second electric charge holding portions is smaller than that of each of the portions in which the first and second electric charge holding portions are formed. Consequently, when applying a voltage to a gate electrode to trap an electric charge into the first or second electric charge holding portion, it is possible to form a deep channel in the semiconductor substrate provided under the portion interposed between the first and second electric charge holding portions, thereby generating a large number of channel hot carriers. Since the channel hot carriers are generated, a probability of trapping can be increased even if the electric charge is trapped into the first electric charge holding portion and another electric charge is then trapped into the second electric charge holding portion. Moreover, the gate electrode is provided between the first and second electric charge holding portions. In the case in which the electric charge is trapped into the first electric charge holding portion and another electric charge is then trapped into the second electric charge holding portion, therefore, the gate electrode provided between the first and second electric charge holding portions functions as a shield. More specifically, the second electric charge holding portion is influenced with difficulty by an electric field induced by the electric charge of the first electric charge holding portion, and the trapping of the electric charge into the second electric charge holding portion is inhibited with difficulty even if scaling progresses. By applying the MIS transistor to a memory cell of a nonvolatile memory, accordingly, it is possible to implement a semiconductor device capable of holding multibit information in one memory cell even if scaling of the nonvolatile memory progresses.

These and other objects, features, aspects and advantages of the present invention will become more apparent from the following detailed description of the present invention when taken in conjunction with the accompanying drawings.

BRIEF DESCRIPTION OF THE DRAWINGS

FIG. 39 is a view showing scaling of a conventional semiconductor device, FIG. 40 is a view showing scaling to be carried out when 2-bit information is to be held in the conventional semiconductor device, FIG. 41 is a view showing a semiconductor device according to a fourteenth embodiment, FIG. 42 is a view showing the case in which information is held in the semiconductor device according to the fourteenth embodiment.

DESCRIPTION OF THE PREFERRED EMBODIMENTS

<First Embodiment>

The present embodiment provides a semiconductor device comprising an MONOS transistor having such a structure that a trench is formed in a channel portion and a silicon nitride film in a gate insulating film is formed as an electric charge holding portion to interpose the trench.

Figure 1:
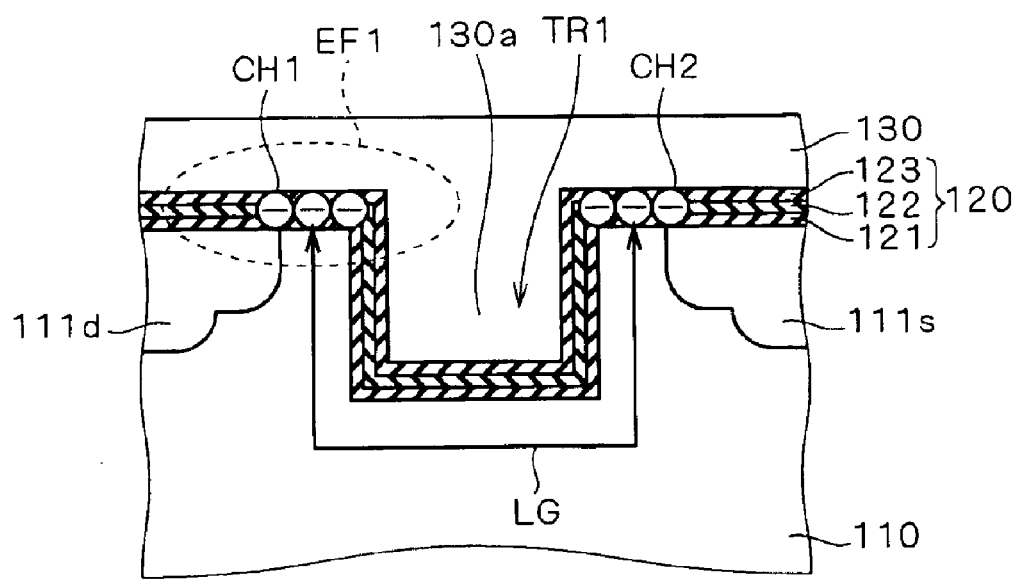
FIG. 1 is a view showing a semiconductor device according to a first embodiment.

FIG. 1 is a view showing an MONOS transistor provided in a semiconductor device according to the present embodiment. As shown in FIG. 1, the MONOS transistor comprises a source region 111s and a drain region 111d which are formed in a semiconductor substrate 110 such as a silicon substrate, a gate insulating film 120 formed on the semiconductor substrate 110, and a gate electrode 130 formed on the gate insulating film 120. The gate insulating film 120 is a laminated film in which a silicon oxide film 121, a silicon nitride film 122 and a silicon oxide film 123 are sequentially provided.

In the present embodiment, a trench TR1 is formed in a channel portion between the source region 111s and the drain region 111d in a surface of the semiconductor substrate 110. Moreover, both the gate insulating film 120 and the gate electrode 130 are formed to enter the trench TR1. A source side portion and a drain side portion in the silicon nitride film 122 which interpose the trench TR1 therebetween and are opposed to each other function as first and second electric charge holding portions capable of holding electric charges CH1 and CH2.

If the trench TR1 is formed in the vicinity of a center of a channel and the gate electrode 130 is formed to enter the trench TR1, thus, a portion 130a of the gate electrode 130 in the trench TR1 functions as a shield when the electric charges CH1 are to be trapped into the first electric charge holding portion and the electric charges CH2 are to be then trapped into the second electric charge holding portion.

In the case in which a programming operation and an erase operation are carried out over the MONOS transistor, a fixed potential of 0 [V] or 3 [V], for example, is given to the gate electrode 130. Consequently, the second electric charge holding portion is not influenced by an electric field EF1 induced by the electric charges CH1 of the first electric charge holding portion. Also in the case in which scaling progresses, the trapping of the electric charges CH2 into the second electric charge holding portion is not inhibited.

Figure 36:
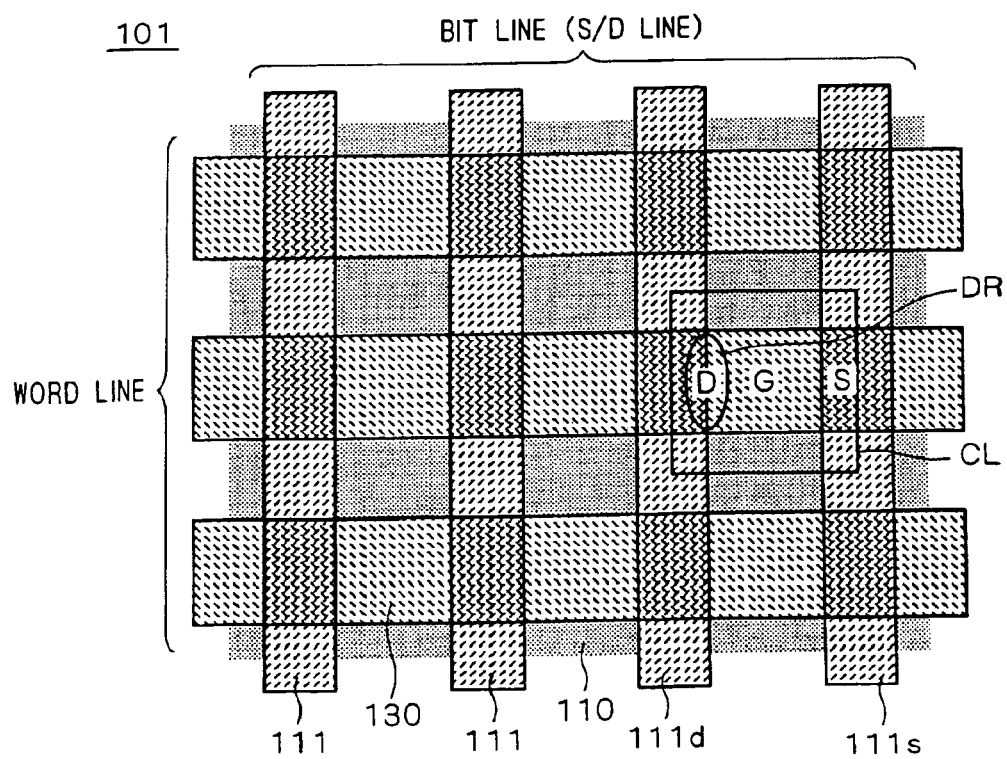
FIG. 36 is a top view showing a structure of the nonvolatile memory.
Figure 37:
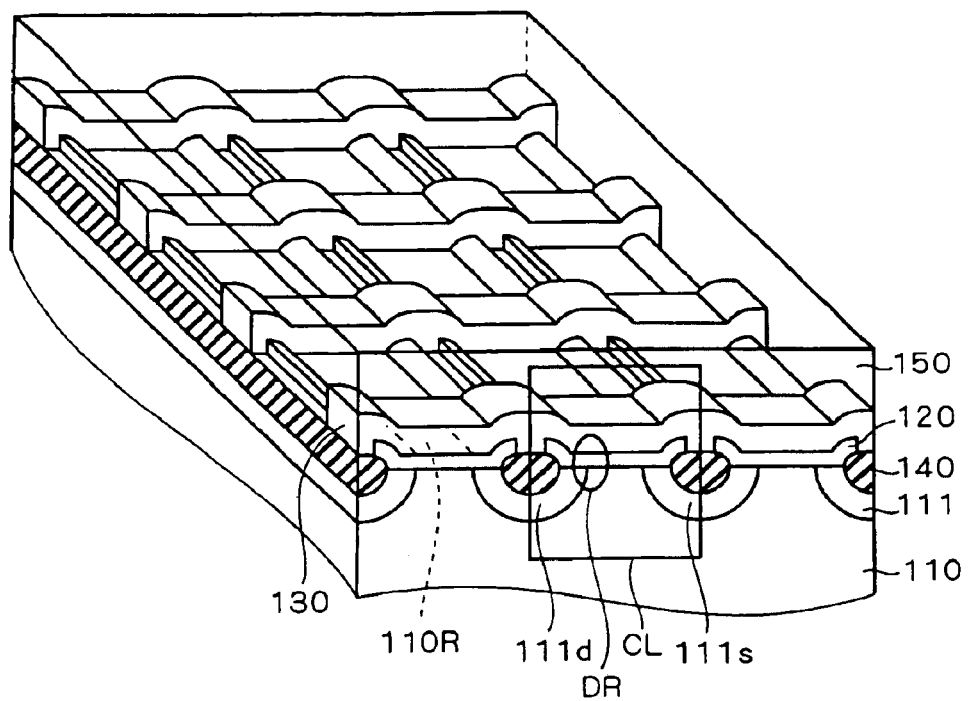
FIG. 37 is a perspective view showing an example of a more specific structure of the nonvolatile memory.
Figure 38:
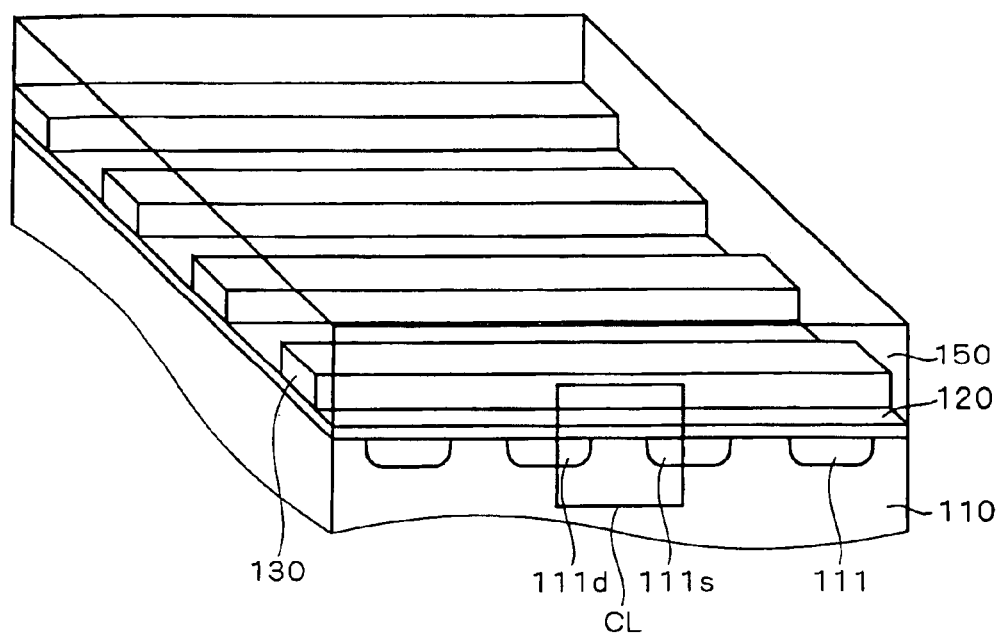
FIG. 38 is a perspective view showing another example of the more specific structure of the nonvolatile memory.

If the MONOS transistor is applied to a memory cell of a nonvolatile memory, therefore, it is possible to implement a semiconductor device capable of holding multibit information in one memory cell even if the scaling for the nonvolatile memory progresses. It is a matter of course that a nonvolatile memory comprising a plurality of memory cells can be constituted by a plurality of MONOS transistors shown in FIG. 1 which are formed on the semiconductor substrate 110 and are arranged like an array as shown in FIGS. 36 to 38.

Figure 35:
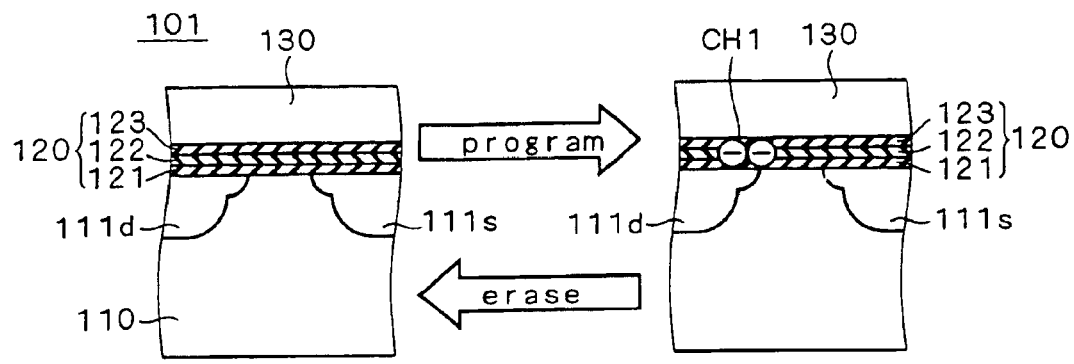
FIG. 35 is a sectional view showing a conventional semiconductor device to be utilized for a memory cell of a nonvolatile memory.

When the MONOS transistor is to be under the programming operation and the erase operation as a memory cell, it is preferable that proper voltages should be applied to the semiconductor substrate 110, the gate electrode 130, the source region 111s and the drain region 111d, respectively, in the same manner as shown in FIG. 35. If electric potentials of the source region 111s and the drain region 111d, respectively, are brought into a floating state and a predetermined electric potential difference is given between the gate electrode 130 and the semiconductor substrate 110, the electric charges CH1 and CH2 trapped into the first and second electric charge holding portions can be collectively extracted into the gate electrode 130 or the semiconductor substrate 110 provided on the channel side, which is convenient for batch erase. Moreover, the electric charges CH1 and CH2 to be trapped are not restricted to electrons but may be holes, for example.

The trench TR1 is formed between the source region 111s and the drain region 111d. Therefore, an effective channel length LG can be increased and a tolerance to a punch-through can also be enhanced.

<Second Embodiment>

The present embodiment is an example of a method of manufacturing the semiconductor device according to the first embodiment.

Figure 2:
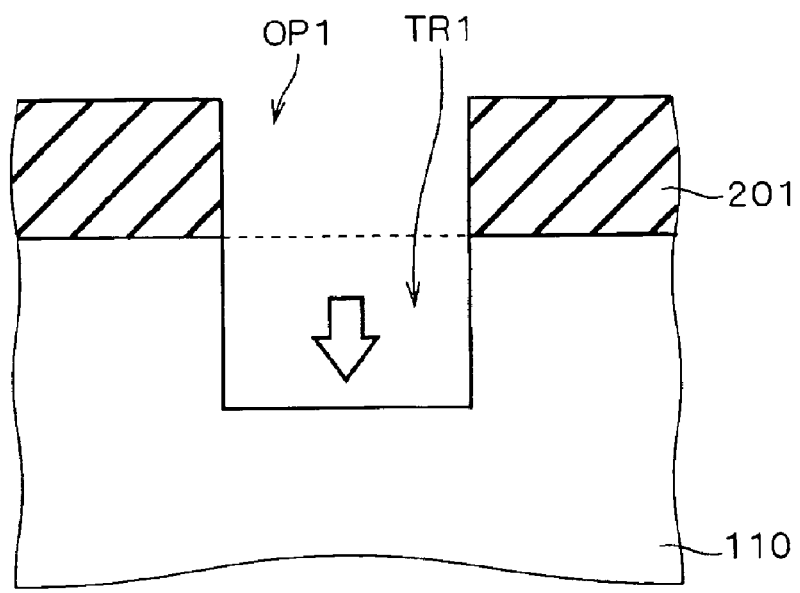
FIGS. 2 to 4 are views showing a method of manufacturing a semiconductor device according to a second embodiment.

First of all, as shown in FIG. 2, a mask 201 such as a photoresist, a silicon oxide film or a silicon nitride film is formed on a semiconductor substrate 110, and an opening OP1 is provided therein so that a trench TR1 is formed on a surface of the semiconductor substrate 110 by anisotropic etching.

Figure 3:
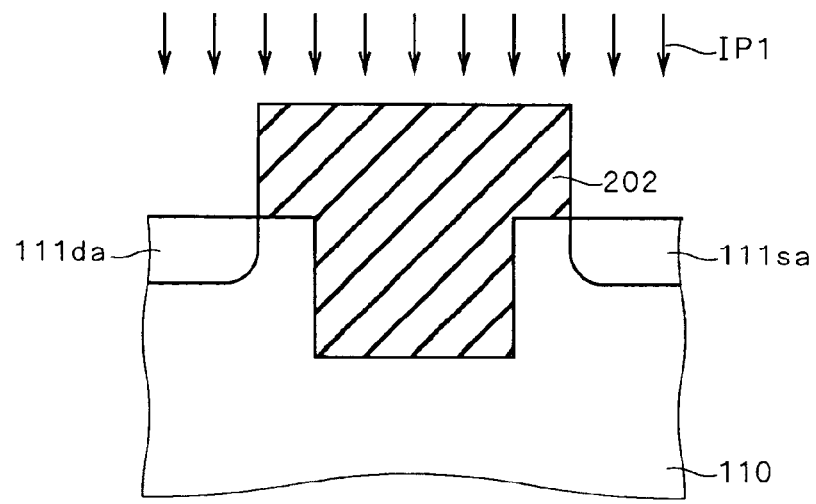

Next, well formation, channel doping and the like are carried out. As shown in FIG. 3, then, a mask 202 such as a photoresist is formed and LDD (Lightly Doped Drain) regions 111sa and 111da are formed by an impurity implantation IP1 in positions facing the surface of the semiconductor substrate 110 with the trench TR1 interposed therebetween. In the same manner, thereafter, an impurity is implanted in a higher concentration than that of each of the LDD regions 111sa and 111da to form a source region 111s and a drain region 111d.

Figure 4:
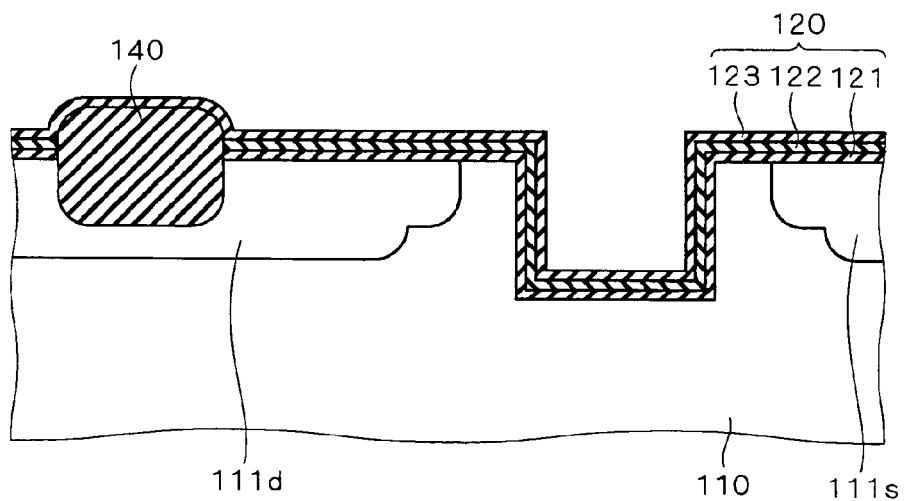

Subsequently, a gate insulating film 120 is formed on the semiconductor substrate 110 (FIG. 4). The gate insulating film 120 is a laminated film in which a silicon oxide film 121, a silicon nitride film 122 and a silicon oxide film 123 are sequentially provided, and the silicon nitride film 122 is used as a mask for forming an isolating region 140 in the present embodiment.

More specifically, in a stage in which the silicon oxide film 121 and the silicon nitride film 122 are completely formed, they are subjected to patterning by a photolithographic technique and an etching technique. By using, as a mask, the lamination of the silicon oxide film 121 and the silicon nitride film 122 which are thus patterned, then, the isolating region 140 is formed in the source region 111s and the drain region 111d by a LOCOS (LOCal Oxidation of Silicon) method or the like, for example. Thereafter, the silicon oxide film 123 is formed over a whole surface of the semiconductor substrate 110.

The silicon oxide film 123 may be formed as another step after the step of forming the isolating region 140. Alternatively, in the case in which a surface of the silicon nitride film 122 is thermally oxidized simultaneously when the isolating region 140 is to be formed by a LOCOS method, the isolating region 140 and the silicon oxide film 123 may be formed at one oxidizing step. According to ISSG (In-Situ Steam Generation) to be a kind of lamp oxidizing method, for example, it is possible to form the isolating region 140 and the silicon oxide film 123 at one step.

When a gate electrode 130 is formed on the gate insulating film 120, subsequently, the MONOS transistor described in the first embodiment is finished.

Thus, the semiconductor device according to the first embodiment can be manufactured. Moreover, the isolating region 140 is formed by using the silicon oxide film 121 and the silicon nitride film 122 as a mask. Therefore, the isolating region 140 can be provided in the middle of the formation of the gate insulating film 120 without formation of a new mask. Accordingly, a manufacturing process can be simplified so that a cost can be reduced.

In the present embodiment, the description has been given to the case in which the LDD regions 111sa and 111da are first formed and the source region 111s and the drain region 111d are then formed.

However, the LDD regions 111sa and 111da may be provided after the formation of the source region 111s and the drain region 111d.

In that case, a mask such as a photoresist is formed on the semiconductor substrate 110 and is first subjected to patterning in such a manner that a source region and a drain region which do not include the LDD region are formed.

Then, an impurity implantation is carried out to form a source region and a drain region which have comparatively high concentrations.

Next, a size of the mask is shrunk (reduced) by resist ashing or the like by demanded amount. Thereafter, an impurity implantation is carried out to form an LDD region having a comparatively low concentration.

Thus, the LDD regions 111sa and 111da can be provided after the formation of the source region 111s and the drain region 111d.

There can be proposed a method utilizing the RELACS (Resolution Enhancement Lithography Assisted by Chemical Shrink) technique according to another example of the case in which the LDD regions 111sa and 111da are first formed and the source region 111s and the drain region 111d are then formed in the same manner as in the above-mentioned case (referring to the RELACS technique, see the Non-Patent Document 4).

In this case, the mask such as a photoresist is formed on the semiconductor substrate 110 and is first subjected to patterning such that an LDD region is formed. Then, an impurity implantation is carried out to form an LDD region having a comparatively low concentration.

Next, a size of the mask is increased by the RELACS technique by demanded amount. Thereafter, an impurity implantation is carried out to form a source region and a drain region which have comparatively high concentrations.

Thus, the source region 111s and the drain region 111d can be provided after the formation of the LDD regions 111sa and 111da.

While the description has been given to the case in which the photoresist is employed for the mask, it is also possible to employ, for the mask, a silicon oxide film, a silicon nitride film, polysilicon and the like which are formed of materials capable of maintaining an etching selection ratio to a material exposed to a substrate or therearound.

In the case in which the source region 111s and the drain region 111d are formed and the LDD regions 111sa and 111da are then formed by using these materials, it is preferable that isotropic etching should be employed during shrinking. To the contrary, in the case in which the source region 111s and the drain region 111d are provided after the formation of the LDD regions 111sa and 111da, it is preferable that the same material as the mask should be deposited and etch back should be carried out during the increase in the mask size to form a sidewall.

A proper material is preferably selected for the mask in consideration of a substrate material and previous and subsequent steps.

Moreover, while the silicon nitride film 122 has been used as the mask for forming the isolating region 140 as shown in FIG. 4 in the present embodiment, it is a matter of course that the mask for forming the isolating region 140 is not restricted to the silicon nitride film 122.

In the same manner as in the general case, a photoresist may be formed on the semiconductor substrate 110 and may be then patterned to be a mask, thereby forming the isolating region 140 by the LOCOS method or the like.

Moreover, it is not essential that the trench TR1 is first formed and the isolating region 140 is then formed. Accordingly, it is also possible to prepare the semiconductor substrate 110 having the isolating region 140 provided previously, thereby forming the trench TR1 thereon.

If the trench TR1 is first formed and the isolating region 140 is then formed, and the silicon nitride film 122 in the gate insulating film 120 is used as a mask for forming the isolating region 140 as in the present embodiment, however, there is an advantage that a useless step can be omitted.

<Third Embodiment>

The present embodiment is another example of the method of manufacturing the semiconductor device according to the first embodiment.

Figure 5:
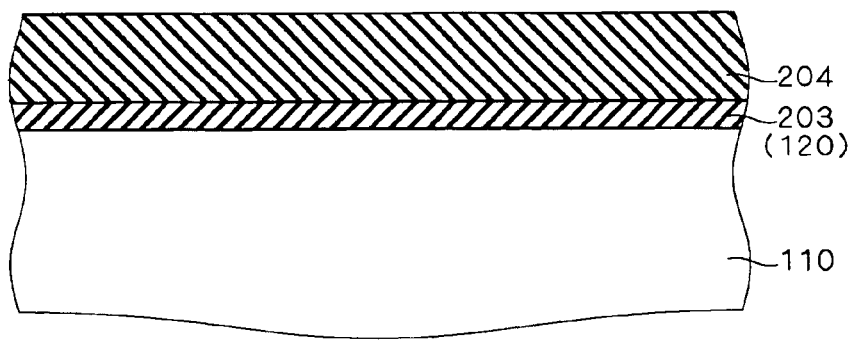
FIGS. 5 to 14 are views showing a method of manufacturing a semiconductor device according to a third embodiment.

First of all, a dummy film (for example, a silicon oxide film) 203 is formed on a semiconductor substrate 110 and a first mask film (for example, a silicon nitride film) 204 having an etching selectivity for the dummy film 203 is further formed on the dummy film 203 (FIG. 5). The reason why (120) is attached to the designation of the dummy film 203 in FIGS. 5 to 13 is that these drawings are also used in a seventh embodiment. In the present embodiment, a portion having (120) attached thereto can be disregarded.

Figure 6:
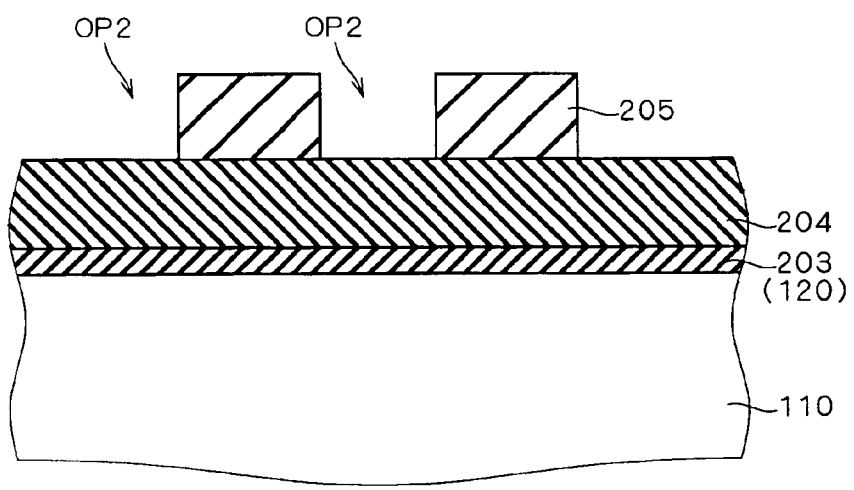
Figure 7:
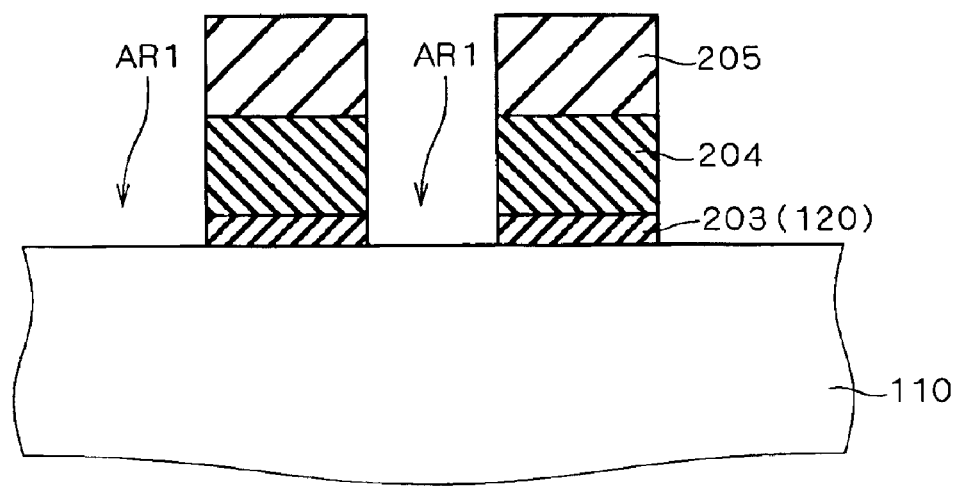

Next, a photoresist 205 is formed and is then patterned to provide an opening OP2 (FIG. 6). Thereafter, anisotropic etching is carried out over the dummy film 203 and the first mask film 204. Consequently, an opening is formed in a region AR1 in which an isolating region is to be formed (FIG. 7).

Figure 8:
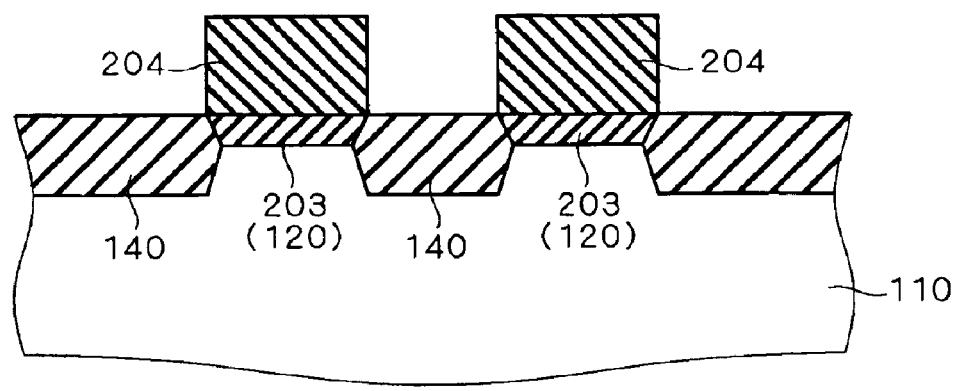
Figure 9:
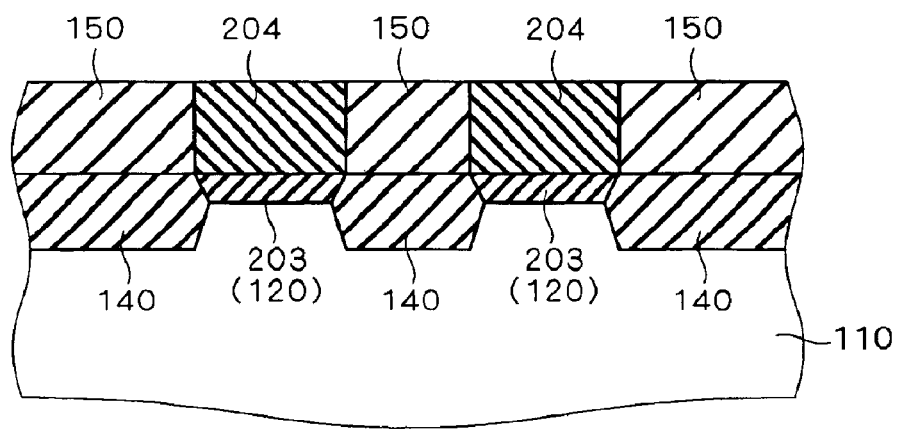
Figure 10:
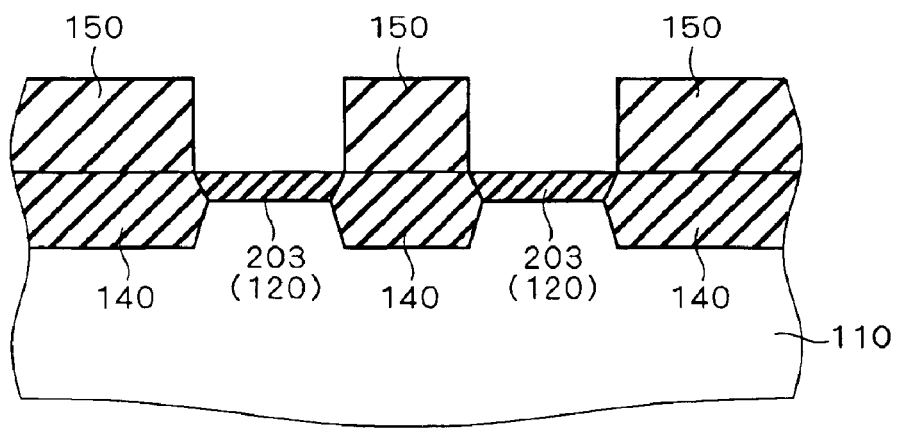

Subsequently, the photoresist 205 is removed and an isolating region 140 is formed, by a LOCOS method or the like, for example, on a surface of the semiconductor substrate 110 exposed to the opening of the region AR1 (FIG. 8). Then, an interlayer insulating film (for example, a silicon oxide film) 150 having an etching selectivity for the first mask film 204 is formed over a whole surface of the semiconductor substrate 110, and a surface thereof is polished by CMP (Chemical Mechanical Polishing) to expose the first mask film 204. Consequently, the interlayer insulating film 150 is buried in the opening of the region AR1 (FIG. 9). By utilizing the etching selectivity, thereafter, the first mask film 204 is removed by etching with the interlayer insulating film 150 and the dummy film 203 left (FIG. 10).

Figure 11:
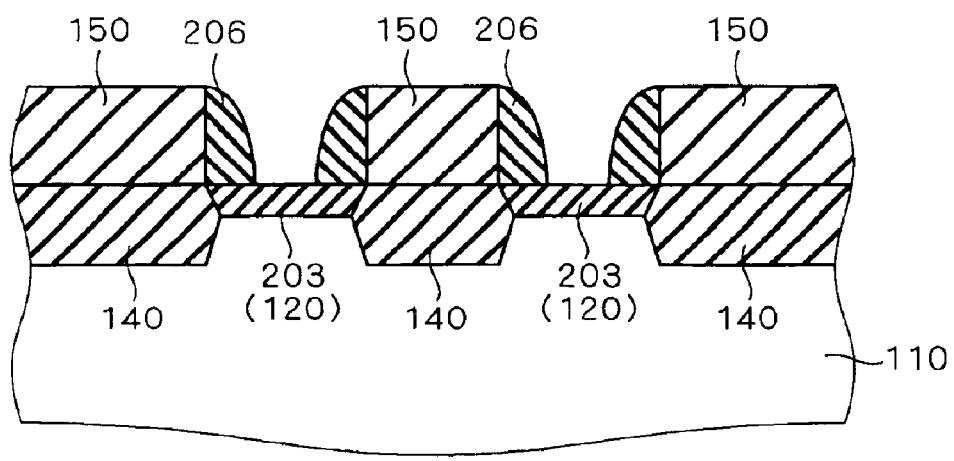

Next, a second mask film (for example, a silicon nitride film) having an etching selectivity for both the interlayer insulating film 150 and the dummy film 203 is formed thereon, and is subjected to etch back. Consequently, a sidewall film 206 is formed in a portion in which the first mask film 204 is removed (FIG. 11).

Figure 12:
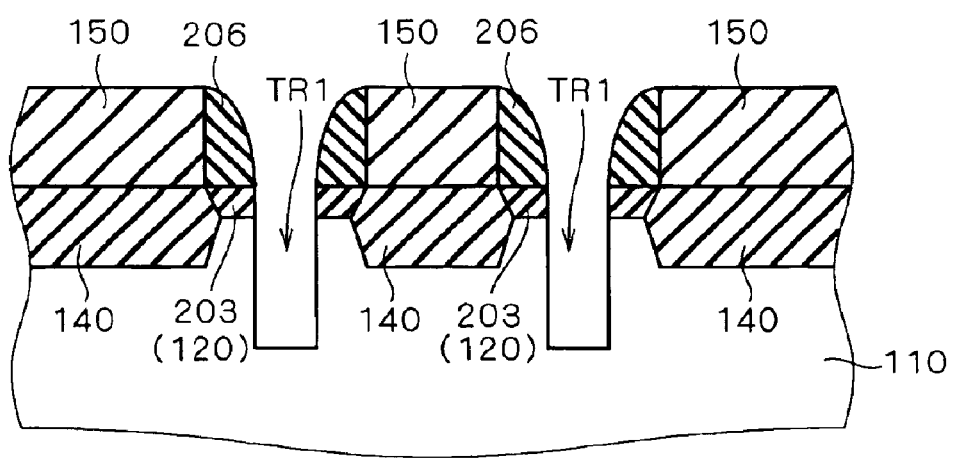
Figure 13:
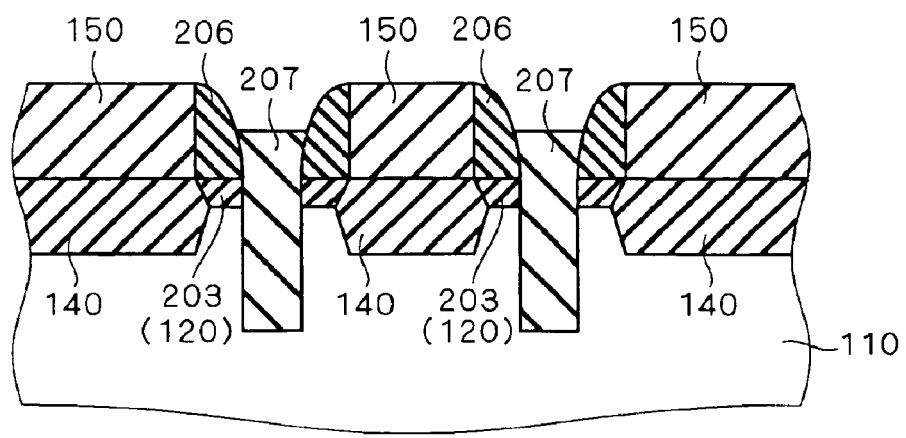

Then, etching is carried out by using the interlayer insulating film 150 and the sidewall film 206 as masks so that a trench TR1 is formed (FIG. 12). Thereafter, an SOG (Spin On Glass) 207 having an etching selectivity for the sidewall film 206 is buried in the trench TR1 (FIG. 13).

Figure 14:
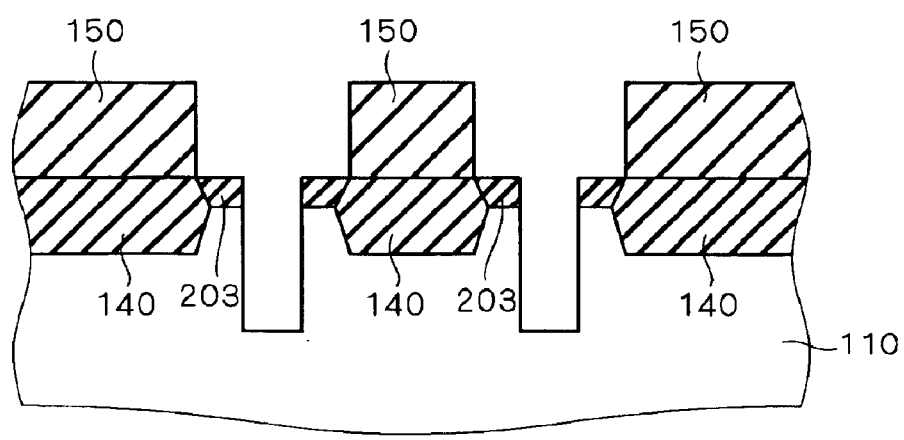

By utilizing the etching selectivity, subsequently, the sidewall film 206 is removed by etching with the SOG 207, the dummy film 203 and the interlayer insulating film 150 left. Thereafter, the SOG is removed (FIG. 14). The SOG has such a characteristic that an etching rate is higher than that of a silicon oxide film formed by a thermal oxidation method or the like. By using the SOG, accordingly, it is possible to remove only the SOG 207 while leaving the interlayer insulating film 150 and the dummy film 203.

Consequently, the trench TR1 is formed on the semiconductor substrate 110. When the dummy film 203 is then removed, therefore, the semiconductor device according to the first embodiment can be manufactured with the execution of the steps in and after FIG. 3 according to the second embodiment.

According to the present embodiment, the trench TR1 is formed with the interlayer insulating film 150 and the sidewall film 206 used as the masks, and the sidewall film 206, the SOG 207 and the dummy film 203 are thereafter removed. Consequently, the trench TR1 can be provided after the formation of the isolating region 140.

<Fourth Embodiment>

The present embodiment is a variant of the semiconductor device according to the first embodiment. The semiconductor device comprises an MONOS transistor having such a structure that a silicon nitride film 122 to be an electric charge holding portion is not formed in a portion of a gate insulating film 120 which enters a trench TR1.

Figure 15:
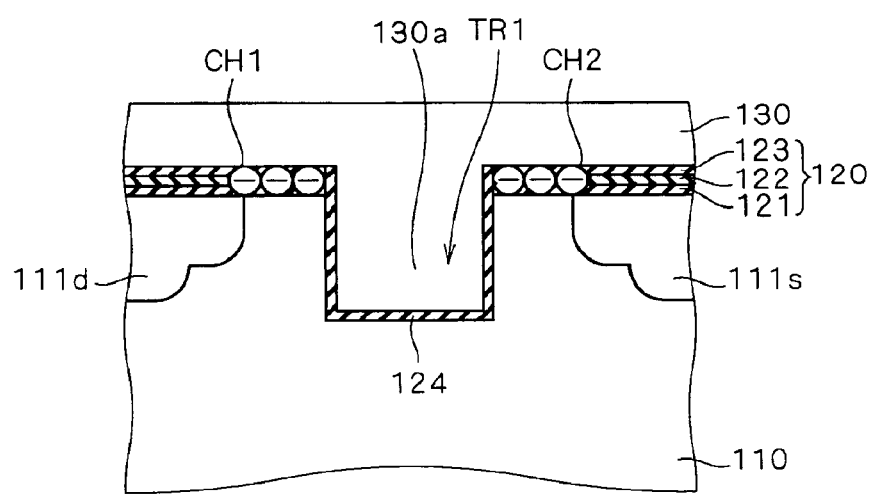
FIG. 15 is a view showing a semiconductor device according to a fourth embodiment.

FIG. 15 is a view showing the MONOS transistor provided in the semiconductor device according to the present embodiment. As shown in FIG. 15, the gate insulating film 120 is not formed in the trench TR1 but a new gate insulating film (for example, a silicon oxide film) 124 is formed in the MONOS transistor. Since other structures are the same as those of the MONOS transistor shown in FIG. 1, description will be omitted.

If the silicon nitride film 122 to be the electric charge holding portion is not formed in the portion of the gate insulating film 120 which enters the trench TR1, thus, a thickness of the gate insulating film 124 in the trench TR1 portion can be reduced. Accordingly, it is possible to reduce a value of a gate voltage required for generating a channel in the trench TR1 portion.

Figure 16:
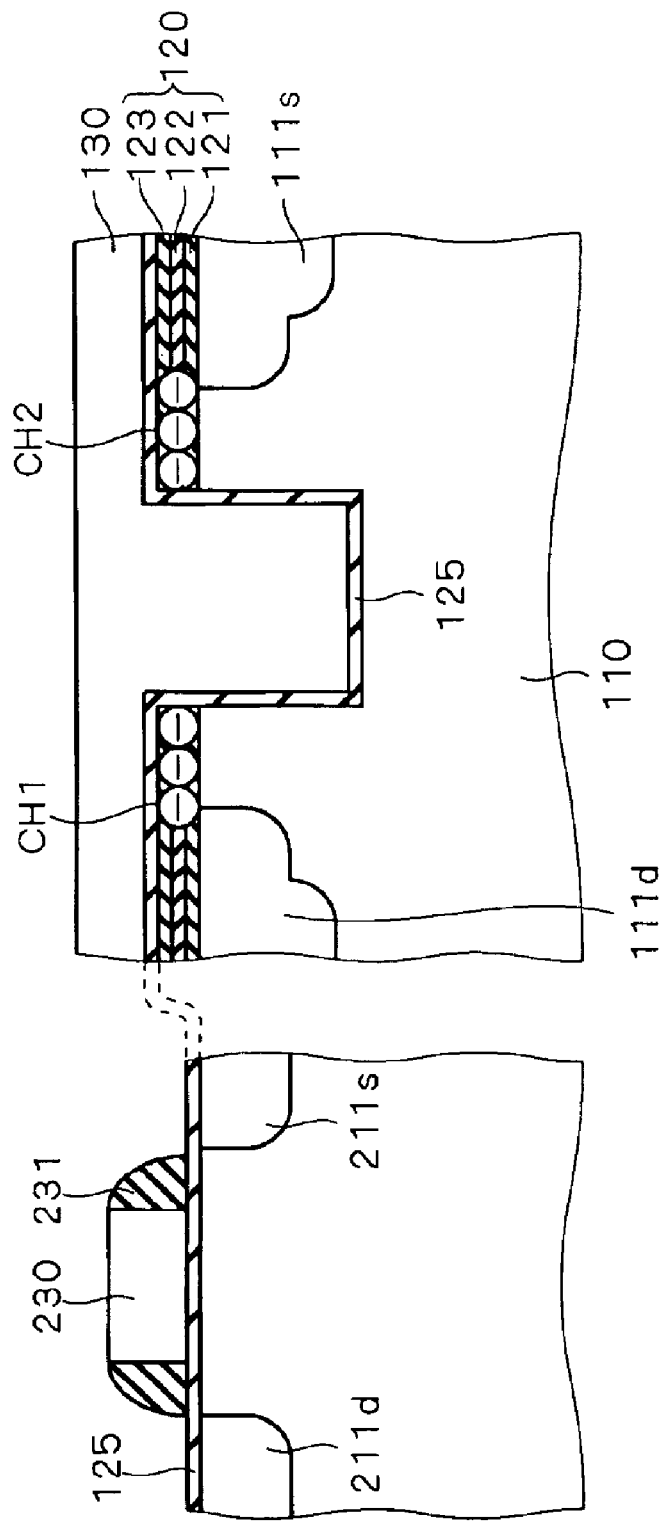
FIG. 16 is a view showing another example of the semiconductor device according to the fourth embodiment.

Moreover, if another MIS transistor having a source region 211s, a drain region 211d, a gate insulating film 125, a gate electrode 230 and a sidewall insulating film 231 is also formed on a semiconductor substrate 110 as shown in FIG. 16, the gate insulating film 125 may be extended in the trench TR1 in place of the new gate insulating film 124 in FIG. 15.

If the MIS transistor is formed on the semiconductor substrate 110, it is also possible to constitute a system LSI (Large Scale Integration) in which the MONOS transistor is used for a memory cell and the MIS transistor is used for a component of a logic circuit, for example.

By extending the gate insulating film 125 of the MIS transistor in the trench TR1, it is possible to set a material of the portion of the gate insulating film in the MONOS transistor which enters the trench TR1 to be identical to that of another gate insulating film 125. For example, an insulating film having a high dielectric constant can be employed for the trench TR1 portion.

<Fifth Embodiment>

The present embodiment is an example of a method of manufacturing the semiconductor device according to the fourth embodiment.

Figure 17:
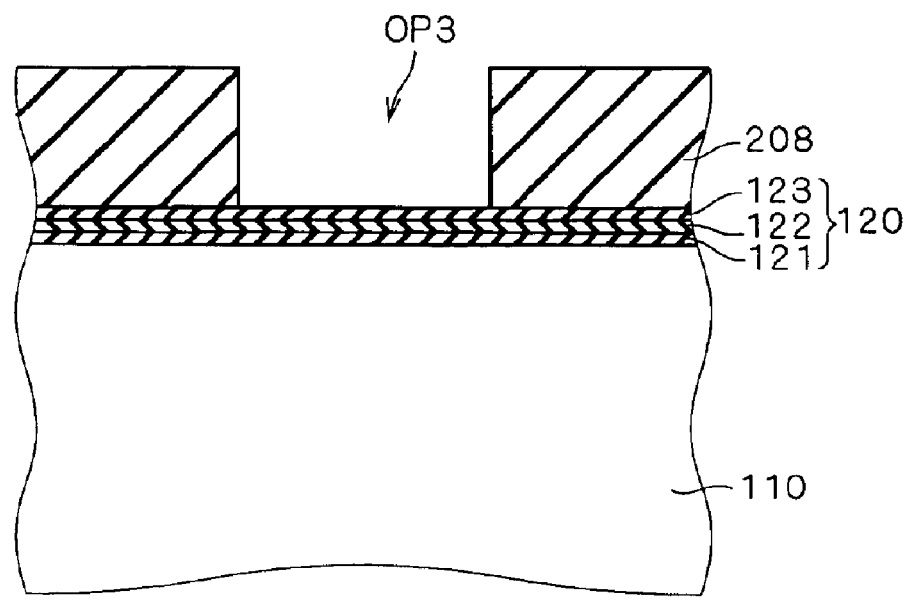
FIGS. 17 to 20 are views showing a method of manufacturing a semiconductor device according to a fifth embodiment.

As shown in FIG. 17, first of all, a silicon oxide film 121, a silicon nitride film 122 and a silicon oxide film 123 are sequentially provided on a semiconductor substrate 110 to form a gate insulating film 120 before formation of a trench TR1. Then, a mask 208 such as a photoresist is formed on the gate insulating film 120 and an opening OP3 is provided thereon.

Figure 18:
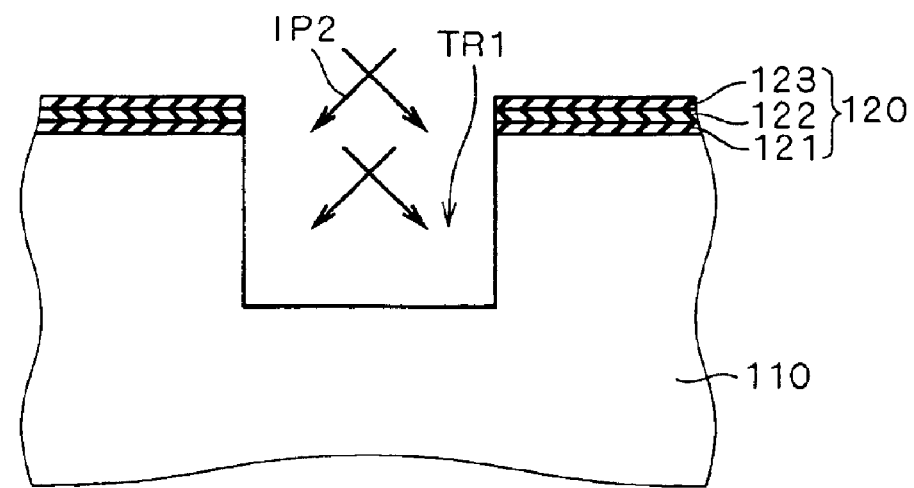

Thereafter, a portion in the gate insulating film 120 which is exposed to the opening OP3 is also etched, and at the same time, the trench TR1 is formed on a surface of the semiconductor substrate 110 by anisotropic etching. Subsequently, the mask 208 is removed and an impurity implantation IP2 is carried out into a channel portion by an oblique rotational implantation method if necessary (FIG. 18). It is preferable that the execution of the impurity implantation IP2 should be determined depending on the setting of a threshold voltage.

Figure 19:
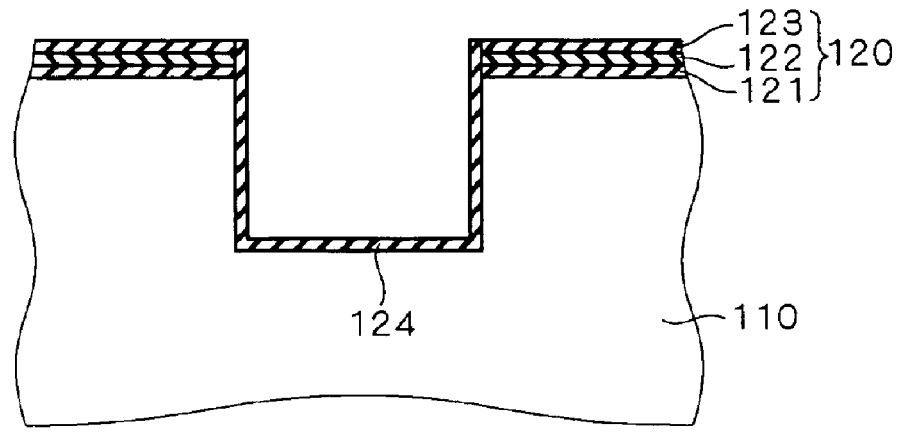

Next, a new gate insulating film 124 is formed in the trench TR1 (FIG. 19). In the case in which the gate insulating film 124 is constituted by a silicon oxide film, it is preferable that a thermal oxidation method or a lamp oxidation method (or an RTO method: Rapid Thermal Oxidation Method) should be employed.

Figure 20:
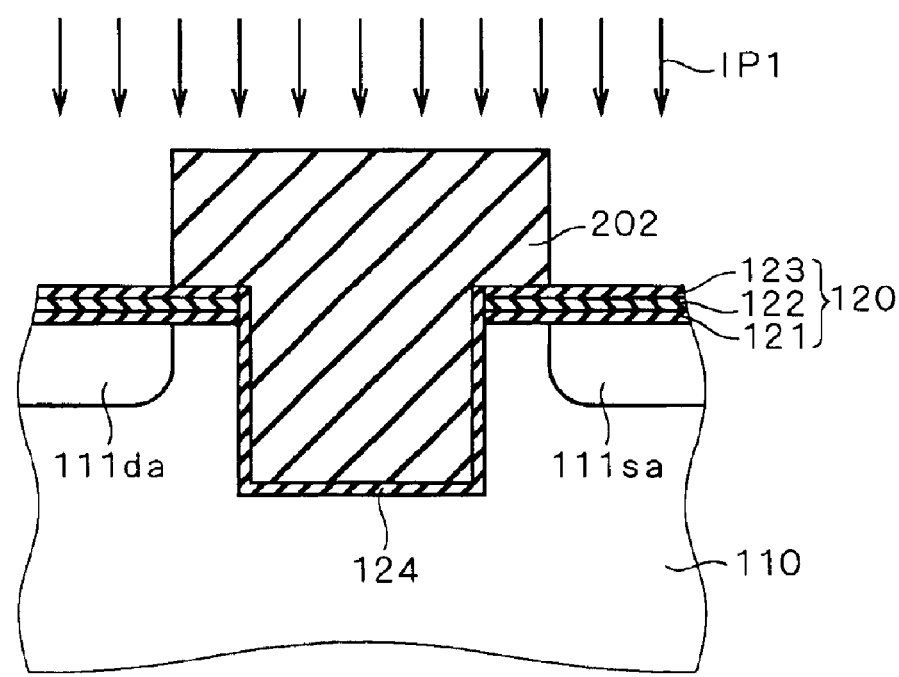

As shown in FIG. 20, then, a mask 202 such as a photoresist is formed and LDD regions 111sa and 111da are formed by an impurity implantation IP1 in positions in the semiconductor substrate 110 which face a surface such that the trench TR1 is interposed therebetween. Thereafter, an impurity is implanted in a higher concentration than that of each of the LDD regions 111sa and 111da in the same manner. Thus, a source region 111s and a drain region 111d are formed.

Subsequently, the mask 202 is removed and a gate electrode 130 is formed on the gate insulating film 120. Consequently, the MONOS transistor shown in FIG. 15 can be manufactured.

In the case in which the structure having the isolating region 140 shown in FIG. 37 is to be manufactured, the silicon oxide film 121 and the silicon nitride film 122 are subjected to patterning by a photolithographic technique and an etching technique in a stage in which the silicon oxide film 121 and the silicon nitride film 122 are completely formed before the stage shown in FIG. 17, for example. Then, it is preferable that the isolating region 140 should be formed by a LOCOS method or the like, for example, by using, as a mask, the silicon oxide film 121 and the silicon nitride film 122 which are thus patterned. Moreover, the source region 111s and the drain region 111d may be provided before the formation of the isolating region 140.

In the case in which the MONOS transistor shown in FIG. 16 is to be manufactured, moreover, it is preferable that a gate insulating film 125 should be formed over a whole surface of the semiconductor substrate 110 after the stage of FIG. 18, for example, and gate electrodes 130 and 230 should be then formed by one patterning process through formation of a source and a drain.

The LDD region and the source and drain may be formed in any order as described in the second embodiment.

<Sixth Embodiment>

The present embodiment is another example of the method of manufacturing the semiconductor device according to the fourth embodiment. In the present embodiment, it is assumed that the structure having the isolating region 140 shown in FIG. 37 is to be manufactured.

Figure 21:
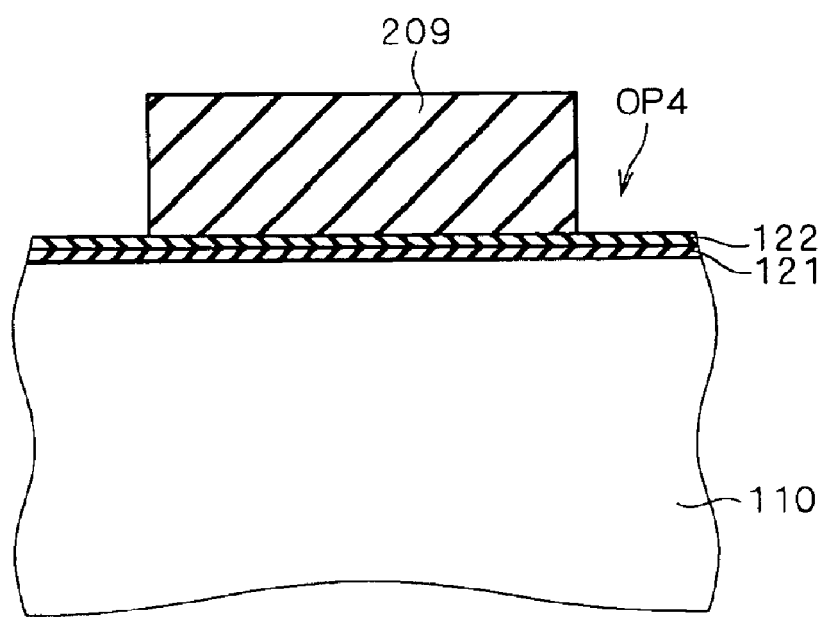
FIGS. 21 to 26 are views showing a method of manufacturing a semiconductor device according to a sixth embodiment.

First of all, a silicon oxide film 121 and a silicon nitride film 122 are formed on a semiconductor substrate 110. Then, a mask 209 such as a photoresist is formed on the silicon nitride film 122 and an opening OP4 is provided on the mask 209 to open a region in which the isolating region 140 is to be formed (FIG. 21).

Figure 22:
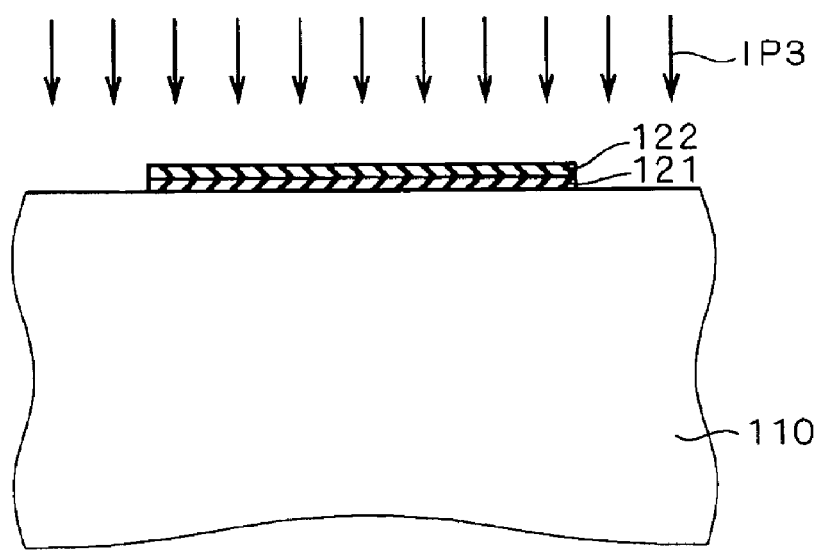

Next, the silicon oxide film 121 and the silicon nitride film 122 which are exposed to the opening OP4 are removed by etching with the use of the mask 209, and the mask 209 is then removed. Thereafter, an impurity implantation IP3 is carried out (FIG. 22) to form a source region 111sb and a drain region 111db in the semiconductor substrate 110.

Figure 23:
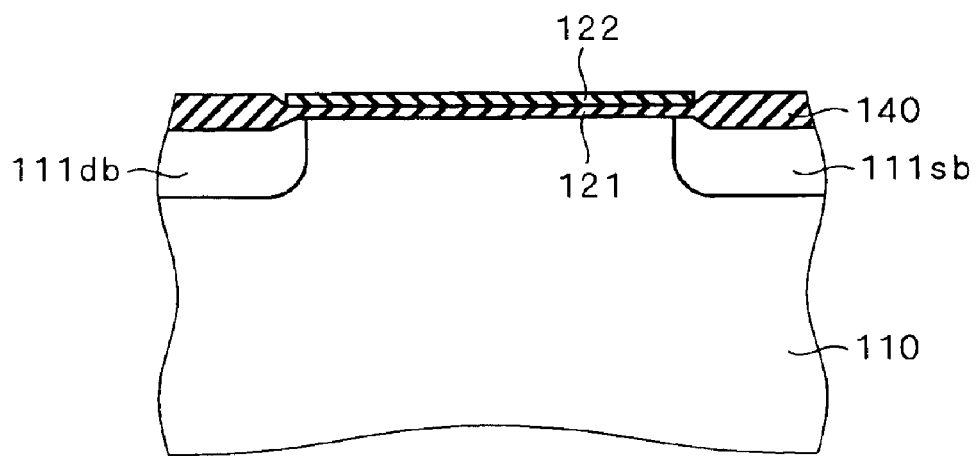
Figure 24:
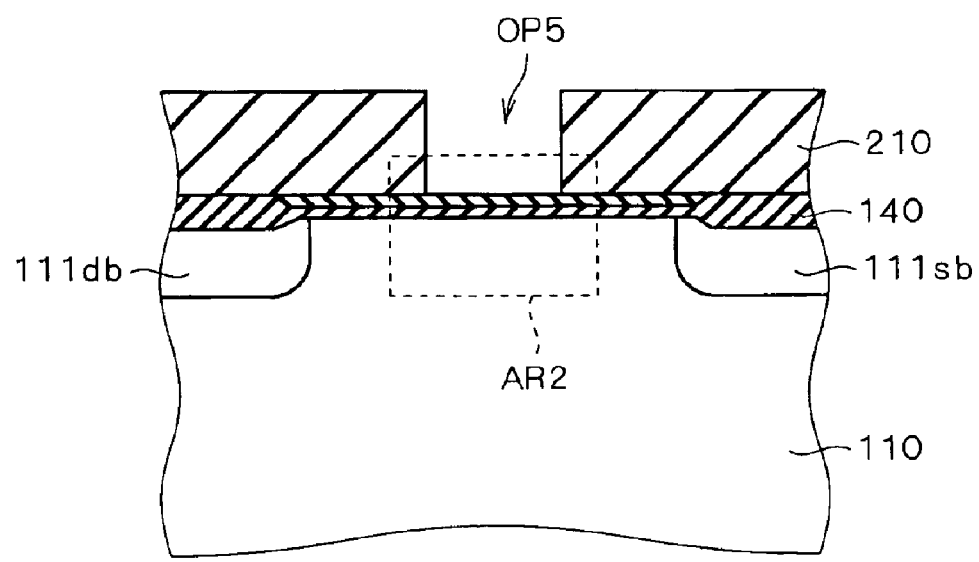

By using the silicon oxide film 121 and the silicon nitride film 122 as a mask, subsequently, the isolating region 140 is formed in the source region 111sb and the drain region 111db by a LOCOS method or the like, for example (FIG. 23). Then, a mask 210 such as a photoresist is formed on the silicon nitride film 122 and the isolating region 140 and an opening OP5 is provided thereon (FIG. 24).

Figure 25:
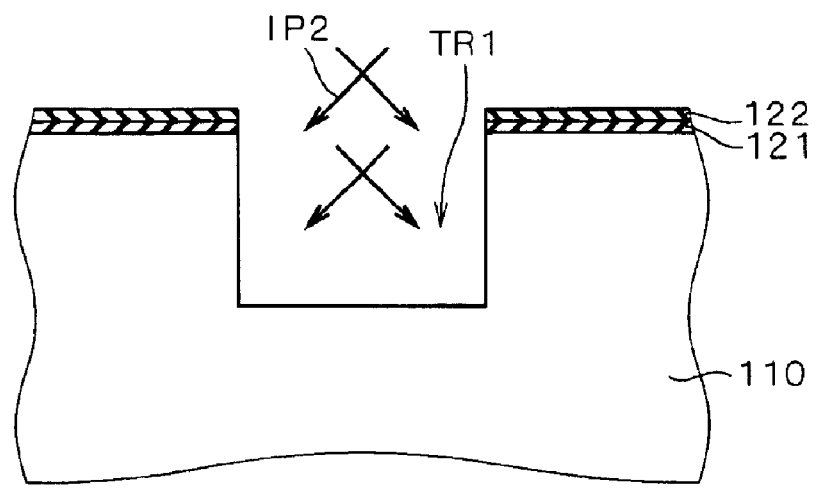

Next, portions of the silicon oxide film 121 and the silicon nitride film 122 which are exposed to the opening OP5 are also etched, and at the same time, a trench TR1 is formed on a surface of the semiconductor substrate 110 by anisotropic etching. Then, the mask 210 is removed and an impurity implantation IP2 is carried out into a channel portion by an oblique rotational implantation method if necessary (FIG. 25). It is preferable that the execution of the impurity implantation IP2 should be determined depending on the setting of a threshold voltage. FIG. 25 shows a region AR2 in FIG. 24 which is enlarged.

Figure 26:
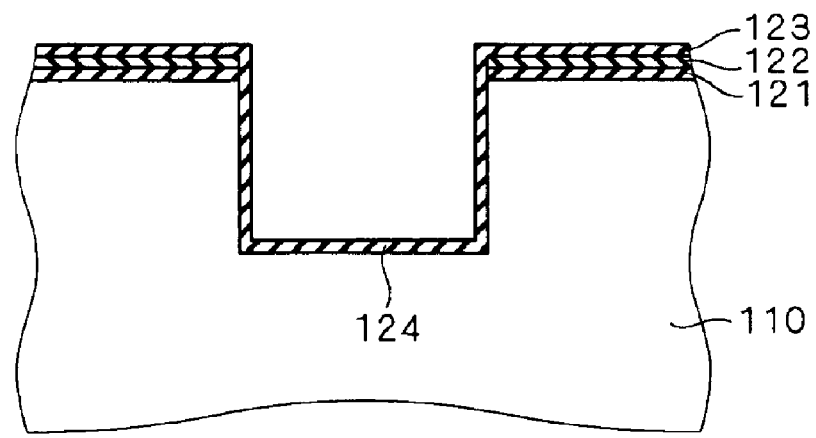

Thereafter, silicon oxide films 123 and 124 are formed over a whole surface of the semiconductor substrate 110 by a thermal oxidation method or the like (FIG. 26) and a gate electrode 130 is formed on the silicon oxide films 123 and 124. Thus, the MONOS transistor shown in FIG. 15 can be manufactured. Moreover, in the case in which the MONOS transistor shown in FIG. 16 is to be manufactured, the gate insulating film 125 of another MIS transistor may be formed in place of the silicon oxide films 123 and 124 in FIG. 26, for example.

In the same manner as in the second embodiment, thus, the isolating region 140 is formed by using the silicon oxide film 121 and the silicon nitride film 122 as the mask. Therefore, it is possible to provide the isolating region 140 in the middle of formation of the gate insulating film 120 without newly forming a mask. Accordingly, a manufacturing process can be simplified so that a cost can be reduced.

As a matter of course, the mask for forming the isolating region 140 is not restricted to the silicon nitride film 122 as described in the second embodiment. Furthermore, it is not essential that the trench TR1 is provided after the formation of the isolating region 140.

<Seventh Embodiment>

The present embodiment is also a further example of the method of manufacturing the semiconductor device according to the fourth embodiment. The present embodiment provides the manufacturing method in which a gate insulating film 120 is first formed in place of the dummy film 203 according to the third embodiment. Accordingly, description will be given with reference to FIGS. 5 to 13 in the third embodiment. In the following, it is assumed that the gate insulating film 120 is formed in place of the dummy film 203 in FIGS. 5 to 13.

First of all, a gate insulating film 120 to be a laminated film comprising a silicon oxide film 121, a silicon nitride film 122 and a silicon oxide film 123 is formed on a semiconductor substrate 110. Then, a first mask film (for example, a silicon nitride film) 204 having an etching selectivity for the silicon oxide film 123 is further formed on the gate insulating film 120 (FIG. 5).

Next, a photoresist 205 is formed and is then patterned to provide an opening OP2 (FIG. 6). Thereafter, anisotropic etching is carried out over the gate insulating film 120 and the first mask film 204. Consequently, an opening is formed in a region AR1 in which an isolating region is to be formed (FIG. 7).

Subsequently, the photoresist 205 is removed and an isolating region 140 is formed, by a LOCOS method or the like, for example, on a surface of the semiconductor substrate 110 exposed to the opening of the region AR1 (FIG. 8). Then, an interlayer insulating film (for example, a silicon oxide film) 150 having an etching selectivity for the first mask film 204 is formed over a whole surface of the semiconductor substrate 110, and a surface thereof is polished by CMP (Chemical Mechanical Polishing) to expose the first mask film 204. Consequently, the interlayer insulating film 150 is buried in the opening of the region AR1 (FIG. 9). By utilizing the etching selectivity, thereafter, the first mask film 204 is removed by etching with the interlayer insulating film 150 and the gate insulating film 120 left (FIG. 10).

Next, a second mask film (for example, a silicon nitride film) having an etching selectivity for both the interlayer insulating film 150 and the silicon oxide film 123 is formed thereon, and is subjected to etch back. Consequently, a sidewall film 206 is formed in a portion in which the first mask film 204 is removed (FIG. 11).

Then, etching is carried out by using the interlayer insulating film 150 and the sidewall film 206 as masks so that a trench TR1 is formed (FIG. 12). Thereafter, an SOG 207 having an etching selectivity for the sidewall film 206 is buried in the trench TR1 (FIG. 13).

Figure 27:
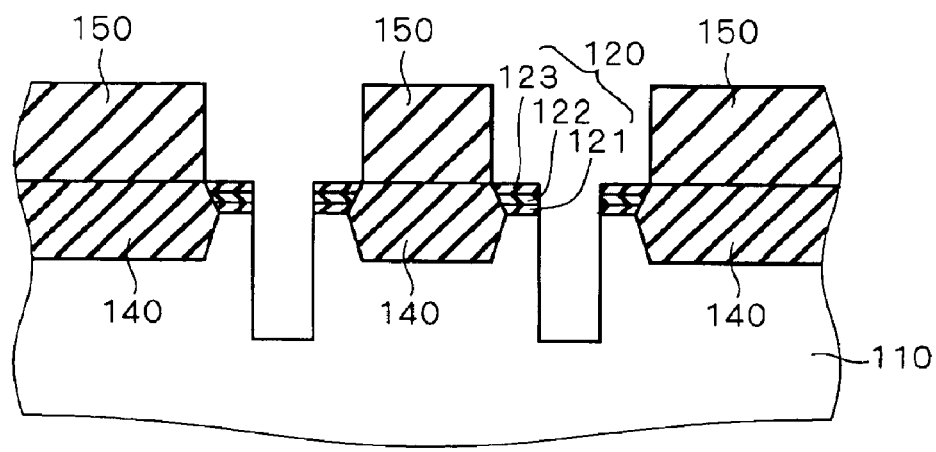
FIG. 27 is a view showing a method of manufacturing a semiconductor device according to a seventh embodiment.

By utilizing the etching selectivity, subsequently, the sidewall film 206 is removed by etching with the SOG 207, the gate insulating film 120 and the interlayer insulating film 150 left. Thereafter, the SOG is removed. This state is shown in FIG. 27. Consequently, the trench TR1 and the gate insulating film 120 are formed on the semiconductor substrate 110. Therefore, the semiconductor device according to the fourth embodiment can be manufactured with the execution of the steps in and after FIG. 18 according to the fifth embodiment.

According to the present embodiment, the trench TR1 is formed with the interlayer insulating film 150 and the sidewall film 206 used as the masks, and the sidewall film 206 and the SOG 207 are thereafter removed. Consequently, the trench TR1 can be provided after the formation of the isolating region 140.

<Eighth Embodiment>

The present embodiment is a variant of the semiconductor device according to the fourth embodiment, comprising an MONOS transistor having such a structure that a silicon nitride film 122 to be first and second electric charge holding portions in a gate insulating film 120 has ends over a source region 111s and a drain region 111d.

Figure 28:
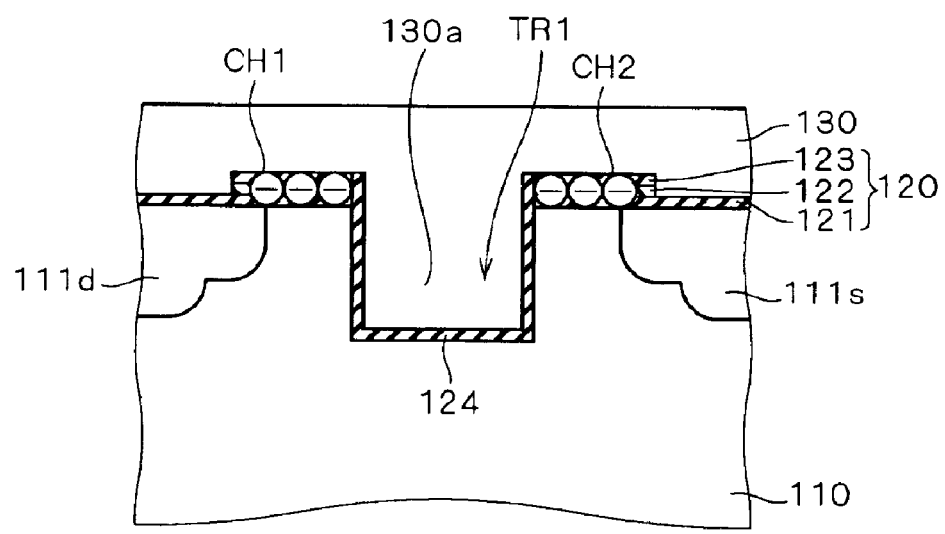
FIG. 28 is a view showing a semiconductor device according to an eighth embodiment.

FIG. 28 is a view showing the MONOS transistor provided in the semiconductor device according to the present embodiment. As shown in FIG. 28, the silicon nitride film 122 and a silicon oxide film 123 formed thereon are terminated over the source region 111s and the drain region 111d in the MONOS transistor. Since other structures are the same as those of the MONOS transistor shown in FIG. 15, description will be omitted.

If the silicon nitride film 122 is terminated over the source region 111s and the drain region 111d, thus, the MONOS transistor is formed continuously as a plurality of memory cells. Also in the case in which a silicon oxide film 121 in the gate insulating film 120 is shared by adjacent transistors, the first and second electric charge holding portions are insulated for each memory cell. Accordingly, movement of electric charges CH1 and CH2 is not caused between the memory cells.

It is hard to suppose that an electric charge trapped into the silicon nitride film 122 is moved. By insulating the first and second electric charge holding portions for each memory cell, it is possible to reliably limit the moving range of the electric charges CH1 and CH2. Consequently, it is possible to suppress an extension of a threshold distribution of the MONOS transistor.

Figure 29:
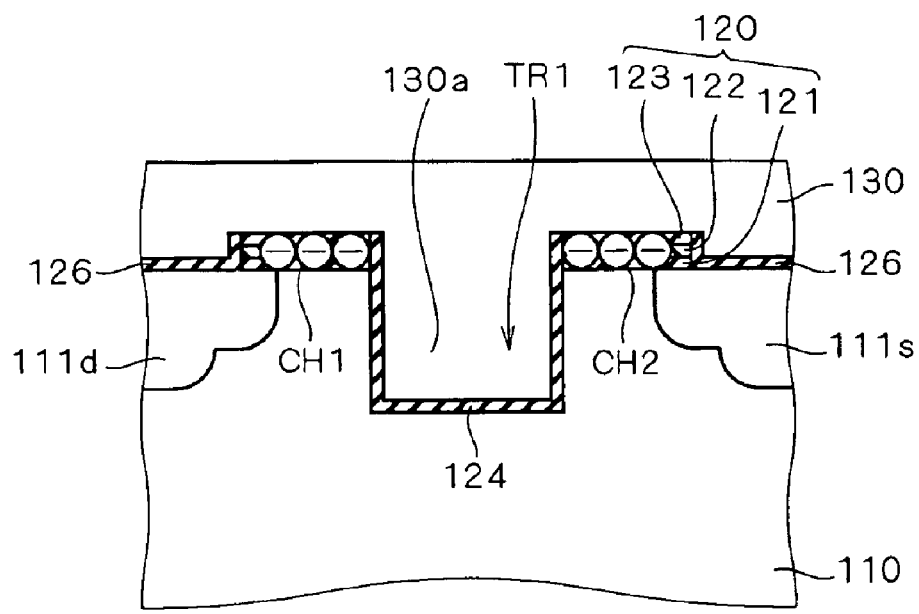
FIG. 29 is a view showing another example of the semiconductor device according to the eighth embodiment.

As shown in FIG. 29, an insulating film (for example, a silicon oxide film) 126 for covering a terminated portion of the silicon nitride film 122 to be the first and second electric charge holding portions may be formed in the terminated portion. Also in the case in which a gate electrode 130 is extended to the terminated portion of the silicon nitride film 122, consequently, the electric charges CH1 and CH2 held in the silicon nitride film 122 can be prevented from being moved into the gate electrode 130.

<Ninth Embodiment>

The present embodiment is an example of a method of manufacturing the semiconductor device according to the eighth embodiment.

Figure 30:
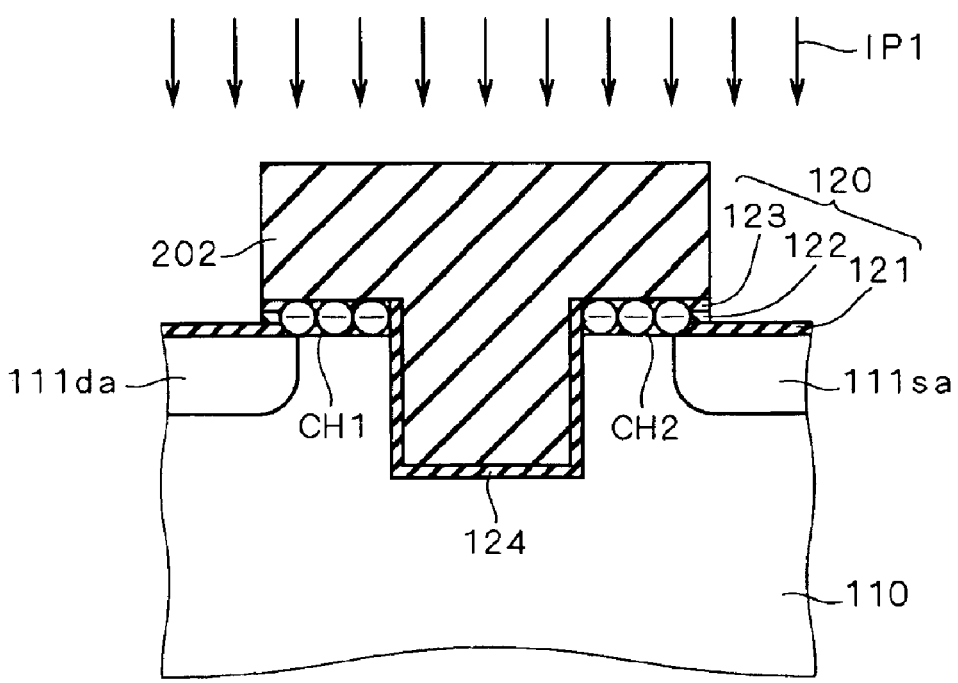
FIG. 30 is a view showing a method of manufacturing a semiconductor device according to a ninth embodiment.

In the present embodiment, the steps shown in FIGS. 17 to 19 are carried out in the same manner as in the method of manufacturing the semiconductor device according to the fifth embodiment. As shown in FIG. 30, then, a mask 202 such as a photoresist is provided to open regions in which LDD regions 111sa and 111da are to be formed. Thereafter, a silicon oxide film 123 and a silicon nitride film 122 in the opened portion are removed by etching such that an electric charge holding portion is terminated over a source region and a drain region.

Subsequently, an impurity implantation IP1 is carried out with the mask 202 left. Thus, the LDD regions 111sa and 111da are formed. In the same manner, then, an impurity implantation is carried out in a higher concentration than that in each of the LDD regions 111sa and 111da. Consequently, a source region 111s and a drain region 111d are formed.

Thereafter, the mask 202 is removed and a gate electrode 130 is formed on a gate insulating film 120. Thus, the MONOS transistor shown in FIG. 28 can be manufactured.

In the case in which the MONOS transistor shown in FIG. 29 is to be manufactured, it is preferable that thermal oxidation should be carried out after the stage of FIG. 30 to form an insulating film 126 for covering a terminated portion of the silicon nitride film 122 to be the electric charge holding portion in the terminated portion, for example.

The LDD region and the source and drain may be formed in any order as described in the second embodiment.

<Tenth Embodiment>

The present embodiment is a variant of the semiconductor device according to the first embodiment, comprising an MONOS transistor having such a structure that corner portions of an upper end and a bottom in a trench TR1 are rounded.

Figure 31:
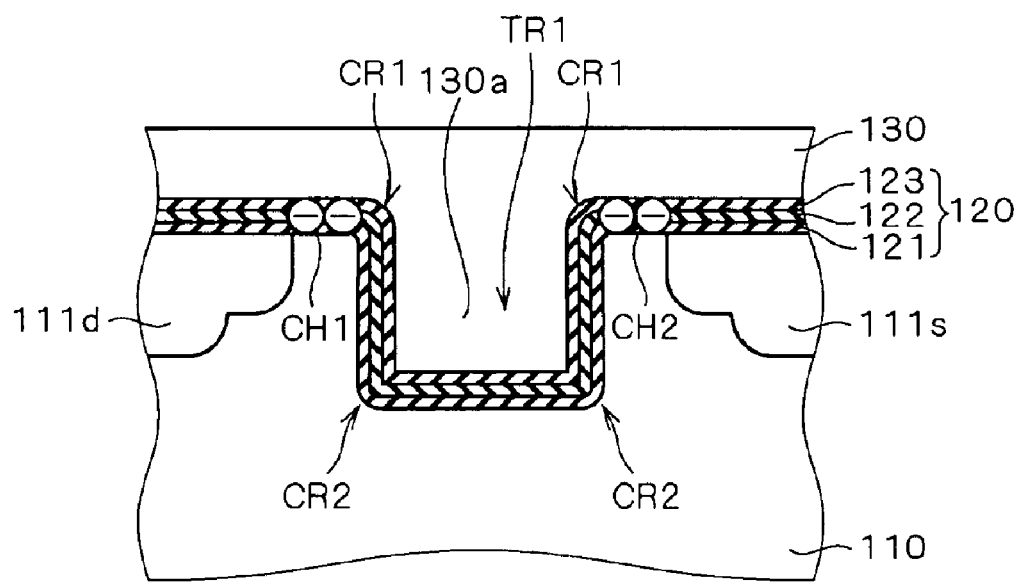
FIG. 31 is a view showing a semiconductor device according to a tenth embodiment.

FIG. 31 is a view showing the MONOS transistor provided in the semiconductor device according to the present embodiment. As shown in FIG. 31, corner portions CR1 and CR2 of the upper end and the bottom in the trench TR1 are rounded in the MONOS transistor. Since other structures are the same as those of the MONOS transistor shown in FIG. 1, description will be omitted.

If the corner portions CR1 and CR2 of the upper end and the bottom in the trench TR1 are thus rounded, a convergence of an electric field in the corner portions can be suppressed and a reliability of the semiconductor device can be thereby enhanced.

<Eleventh Embodiment>

The present embodiment is an example of a method of manufacturing the semiconductor device according to the tenth embodiment.

Figure 32:
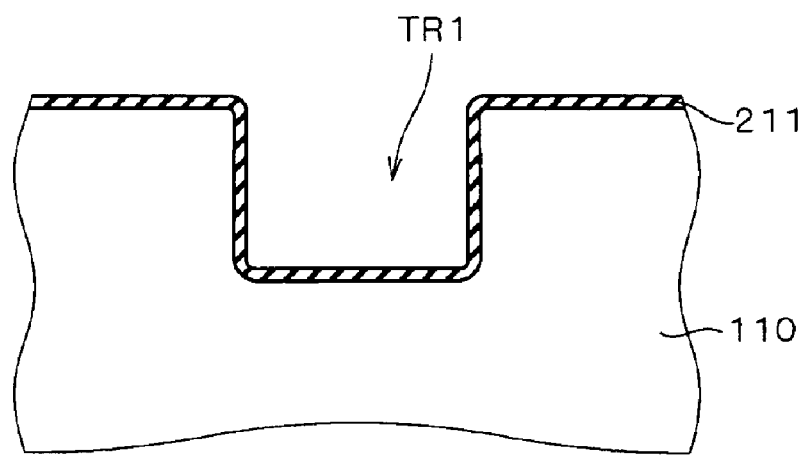
FIGS. 32 and 33 are views showing a method of manufacturing a semiconductor device according to an eleventh embodiment.

In the present embodiment, the step shown in FIG. 2 is carried out to form a trench TR1 in a semiconductor substrate 110 in the same manner as in the method of manufacturing the semiconductor device according to the second embodiment. As shown in FIG. 32, then, a sacrificial layer 211 comprising a silicon oxide film or the like, for example, is formed on a surface of the trench TR1. It is preferable that a thermal oxidation method should be used for the formation of the sacrificial layer 211, for example.

Figure 33:
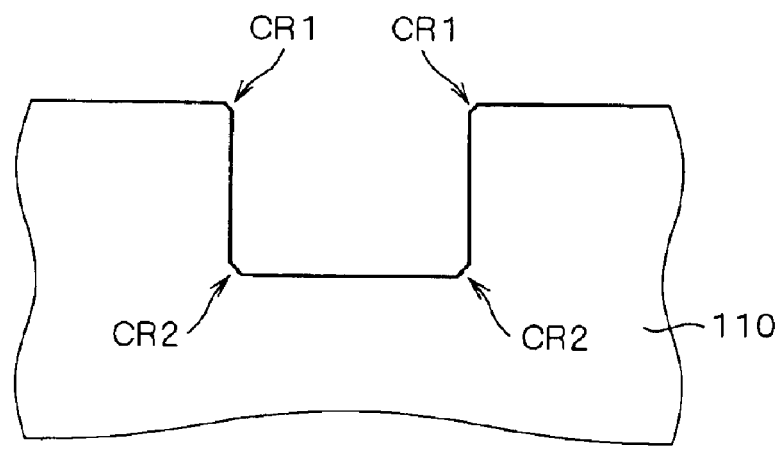

Thereafter, the sacrificial layer 211 is removed by wet etching using hydrofluoric acid, for example. As shown in FIG. 33, consequently, corner portions CR1 and CR2 of an upper end and a bottom in the trench TR1 are rounded. Subsequently, the steps in and after FIG. 3 are carried out in the same manner as in the second embodiment so that the MONOS transistor shown in FIG. 31 can be manufactured.

<Twelfth Embodiment>

The present embodiment is also a variant of the semiconductor device according to the first embodiment, in which a gate insulating film having a plurality of dots to be insular regions which are formed of silicon is employed for a gate insulating film in place of a lamination structure including a silicon nitride film.

A technique for forming a silicon dot in a silicon oxide film has been described in the Non-Patent Document 5, for example. In the present embodiment, such a silicon oxide film including a silicon dot is employed for a gate insulating film.

Figure 34:
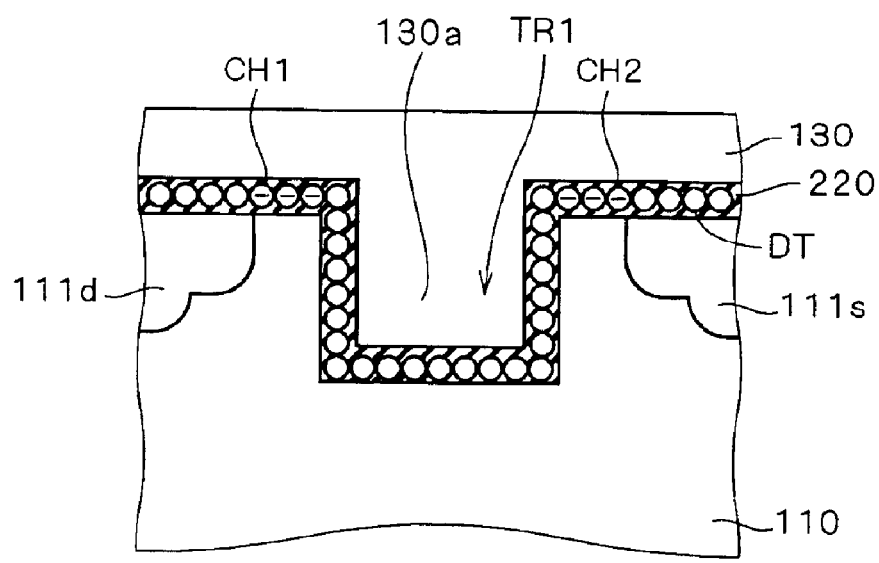
FIG. 34 is a view showing a semiconductor device according to a twelfth embodiment.

FIG. 34 is a view showing an MIS transistor provided in a semiconductor device according to the present embodiment. In FIG. 34, the semiconductor device according to the present embodiment has the same structure as that of the semiconductor device according to the first embodiment except that the gate insulating film 120 is replaced with a gate insulating film (for example, a silicon oxide film) 220 having such a single layer structure as to include a silicon dot DT.

In the first embodiment, the electric charges CH1 and CH2 are held in trap levels in the silicon nitride film 122. Since the trap level is present on a defect portion in the silicon nitride film 122, a value of the trap level is ununiform depending on a location. For this reason, in the case in which the electric charges CH1 and CH2 thus held are stored for a long period of time, there is a possibility that the electric charges CH1 and CH2 might get out if an energy fluctuates. In particular, an electric charge trapped into a shallow level flies out more easily than an electric charge trapped into a deep level.

Since the silicon dot DT has a conductiveness, a trap level is deeper than that of a silicon nitride film and is stable irrespective of a location, resulting in a reduction in a probability that the held electric charge will get out. This implies that movement of the held electric charge is caused with more difficulty than that in the case in which first and second electric charge holding portions constitute a continuous film in the gate insulating film 120, for example, the silicon nitride film 122 in the first embodiment, and a semiconductor device having a more excellent nonvolatility can be implemented.

A technique for forming a silicon nitride film like a dot in a silicon oxide film in place of the silicon dot has been described in the Patent Document 3 (see FIG. 1 in the publication), for example. In a dot-like silicon nitride film, the movement of the held electric charge is caused with more difficulty than that in the continuous film of the gate insulating film 120. Thus, it is possible to suppose that the same effects as those of the silicon dot DT can be obtained.

<Thirteenth Embodiment>

In the twelfth embodiment, there has been described the structure in which the gate insulating film 120 according to the first embodiment is replaced with the gate insulating film 220 having such a single layer structure as to include the dot DT of silicon or a silicon nitride film. The gate insulating film 220 including the dot DT can be replaced with the gate insulating film 120 in all the second to eleventh embodiments.

In other words, the first to twelfth embodiments of the present invention can be applied to a structure of an MIS transistor in which an electric charge holding portion capable of holding electric charges such as an ONO film or a dot is formed in a gate insulating film thereof.

<Fourteenth Embodiment>

The present embodiment provides a semiconductor device comprising an MONOS transistor having such a structure that a silicon nitride film in a gate insulating film is set to be an electric charge holding portion and the gate insulating film provided in a central part of a channel is constituted by only a silicon oxide film to be a lower layer.

FIG. 41 is a view showing the MONOS transistor provided in the semiconductor device according to the present embodiment. As shown in FIG. 41, the MONOS transistor comprises a source region 111s and a drain region 111d which are formed in a semiconductor substrate 110 such as a silicon substrate, a gate insulating film 120a formed on the semiconductor substrate 110, and a gate electrode 130 formed on the gate insulating film 120a.

The gate insulating film 120a is a laminated film having a silicon oxide film 127, a silicon nitride film 128 and a silicon oxide film 129 provided in this order in a portion other than the upper part of the central part of the channel. On the central part of the channel, the gate insulating film 120a is constituted by only an extended portion 127a of the silicon oxide film 127.

In the present embodiment, the silicon nitride films 128 formed opposite to each other in such a direction as to connect the source region 111s and the drain region 111d away from each other function as first and second electric charge holding portions 128b and 128a capable of holding electric charges CH1 and CH2.

On the central part of the channel, that is, a portion of the gate insulating film 120a which is interposed between the first and second electric charge holding portions 128b and 128a, the gate insulating film 120a is constituted by only the extended portion 127a of the silicon oxide film 127 as described above. Accordingly, a thickness of that portion is smaller than that of a laminated film portion provided with the first and second electric charge holding portions 128b and 128a. Moreover, a portion 130c of the gate electrode 130 on the central part of the channel is provided between the first and second electric charge holding portions 128b and 128a. More specifically, ends of the first and second electric charge holding portions 128b and 128a are provided in contact with the portion 130c of the gate electrode 130 on the central part of the channel at a surface 130b.

Figure 43:
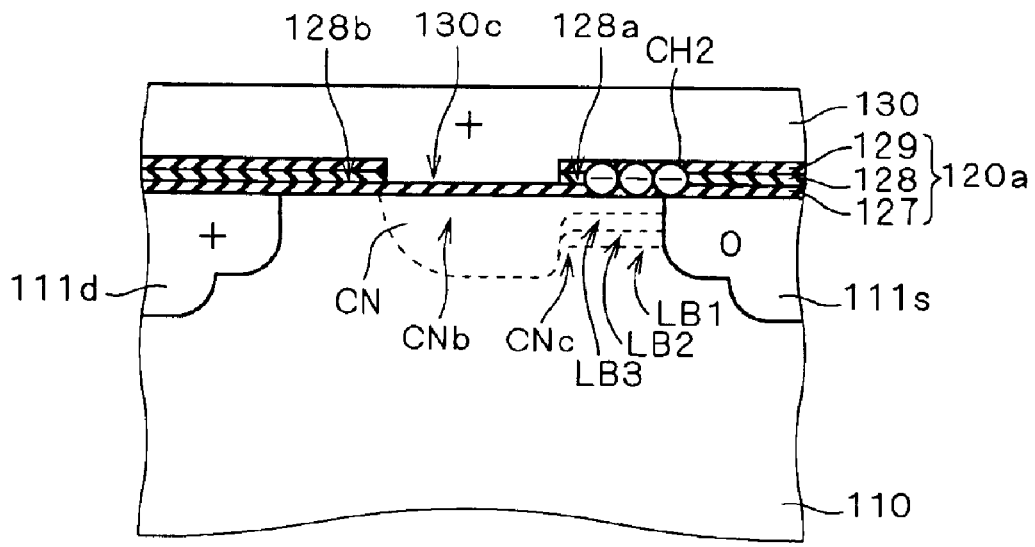
FIG. 43 is a view showing the case in which the information is read in the semiconductor device according to the fourteenth embodiment.

FIG. 42 is a view showing the case in which information is held in the semiconductor device according to the present embodiment. Moreover, FIG. 43 is a view showing the case in which the information is read in the semiconductor device according to the present embodiment.

FIG. 42 shows a state in which a ground potential 0 [V] (indicated as "0") is applied to the drain region 111d and higher electric potentials than the ground potential (both of them are indicated as "+") are applied to the source region 111s and the gate electrode 130 to form a channel CN in the semiconductor substrate 110, thereby writing the information. Based on the ground potential, for example, it is preferable that the electric potential to be applied to the source region 111s should be set to 5 [V] and the electric potential to be applied to the gate electrode 130 should be set to 9 [V].

Portions provided with the first and second electric charge holding portions 128b and 128a are laminated films and the gate insulating film 120a has a great thickness. Accordingly, a channel CNa is formed shallowly in the semiconductor substrate 110 by application of a voltage to the gate electrode 130 under the laminated film.

In the central part of the channel, moreover, only the extended portion 127a of the silicon oxide film 127 is provided and the gate insulating film 120a has a small thickness. In the central part of the channel, accordingly, a channel CNb is formed deeply in the semiconductor substrate 110 by the application of a voltage to the gate electrode 130.

By the application of a voltage to each portion, the electric charge (for example, electron) CH2 is moved as a channel hot electron from the drain region 111d toward the source region 111s with acceleration. Then, the electric charge CH2 is trapped into the second electric charge holding portion 128a in the vicinity of a pinch-off point PN of the channel CN.

On the other hand, FIG. 43 shows a state in which a ground potential 0 [V] (indicated as "0") is applied to the source region 111s and higher electric potentials than the ground potential (both of them are indicated as "+") are applied to the drain region 111d and the gate electrode 130 to form the channel CN in the semiconductor substrate 110, thereby reading the information. Based on the ground potential, for example, it is preferable that the electric potential to be applied to the drain region 111d should be set to 1.6 [V] and the electric potential to be applied to the gate electrode 130 should be set to 3.5 [V].

Depending on the number of the electric charges CH2 trapped into the second electric charge holding portion 128a, a depth of a channel CNc formed in the semiconductor substrate 110 under the second electric charge holding portion 128a is varied as shown in LB1 to LB3. A threshold voltage of the MONOS transistor is changed by a difference in the depths LB1 to LB3. By detecting a change in the threshold voltage, it is possible to decide whether one-bit information is stored in a memory cell or not.

In the case in which an erase operation is to be carried out, moreover, it is preferable that proper voltages should be applied to the gate electrode 130, the source region 111s and the drain region 111d, respectively. For example, it is preferable that the electric potential to be applied to the drain region 111d should be set to 8 [V] and the electric potential to be applied to the gate electrode 130 should be set to 0 [V]. Alternatively, it is preferable that the electric potential to be applied to the drain region 111d should be set to 5 [V] and the electric potential to be applied to the gate electrode 130 should be set to –6 [V]. If the electric potentials of the source region 111s and the drain region 111d, respectively, are brought into a floating state and a predetermined electric potential difference is given between the gate electrode 130 and the semiconductor substrate 110, the electric charges CH1 and CH2 trapped into the first and second electric charge holding portions can also be extracted collectively into the gate electrode 130 or the semiconductor substrate 110 provided on the channel side, which is convenient for batch erase.

FIG. 42 does not show the electric charge CH1 in the first electric charge holding portion 128b. Also in the case in which the electric charge CH1 has already been trapped into the first electric charge holding portion 128b as shown in FIG. 41, the electric charge CH2 can be trapped into the second electric charge holding portion 128a in the semiconductor device according to the present embodiment. The reason is as follows.

As described above, the channel CNb is formed deeply in the central part of the channel. Consequently, it is possible to generate a large number of channel hot carriers (channel hot electrons in case of an electron). Since the channel hot carriers are generated, a probability of trapping can be increased even if the electric charge CH1 is trapped into the first electric charge holding portion 128b and the electric charge CH2 is then trapped into the second electric charge holding portion 128a.

Moreover, the gate electrode 130 is provided between the first and second electric charge holding portions 128b and 128a. In the case in which the electric charge CH1 is trapped into the first electric charge holding portion 128b and the electric charge CH2 is then trapped into the second electric charge holding portion 128a, therefore, the portion 130c of the gate electrode 130 above the central part of the channel functions as a shield.

More specifically, in the present embodiment, the probability of trapping is high and the portion 130c of the gate electrode 130 above the central part of the channel functions as the shield as described above. Consequently, the second electric charge holding portion 128a is influenced with difficulty by an electric field EF1 induced by the electric charge CH1 in the first electric charge holding portion 128b and the trapping of the electric charge CH2 into the second electric charge holding portion 128a is inhibited with difficulty even if scaling progresses. By applying the MIS transistor to a memory cell of a nonvolatile memory, accordingly, it is possible to implement a semiconductor device capable of holding multibit information in one memory cell even if scaling of the nonvolatile memory progresses. As a matter of course, if a plurality of MONOS transistors described with reference to FIG. 41 are formed on the semiconductor substrate 110 and are provided in an array as shown in FIGS. 36 to 38, a nonvolatile memory including a plurality of memory cells can be constituted.

It is preferable that lengths L1 and L3 in a direction of a channel length of the first and second electric charge holding portions 128b and 128a shown in FIG. 41 and a length L2 in the direction of the channel length of the extended portion 127a of the silicon oxide film 127 should be properly set depending on a design position of the pinch-off point PN, an operating voltage to be applied to the gate electrode 130, the source region 111s and the drain region 111d, a transistor size and the like. For example, it is supposed that the electric charge is injected in the vicinity of the pinch-off point PN. For this reason, it is preferable that the length L3 in the direction of the channel length should be set to position the second electric charge holding portion 128a on the pinch-off point PN.

Both of the first and second electric charge holding portions 128b and 128a are the silicon nitride film 128 in the laminated film having the silicon oxide film 127, the silicon nitride film 128 and the silicon oxide film 129 provided on the semiconductor substrate 110 in this order. The silicon nitride film 128 is interposed between the silicon oxide films 127 and 129. Therefore, the electric charges CH1 and CH2 held in the silicon nitride film 128 can be prevented from being moved into the gate electrode 130 and the semiconductor substrate 110.

Moreover, a portion of the gate insulating film 120a which is interposed between the first and second electric charge holding portions 128b and 128a is the extended portion 127a of the silicon oxide film 127. Accordingly, the silicon oxide film 127 in the laminated film can be utilized as a thin film portion of the gate insulating film 120a. Thus, the semiconductor device can easily be manufactured.

The electric charges CH1 and CH2 to be trapped are not restricted to electrons but may be holes, for example.

Figure 44:
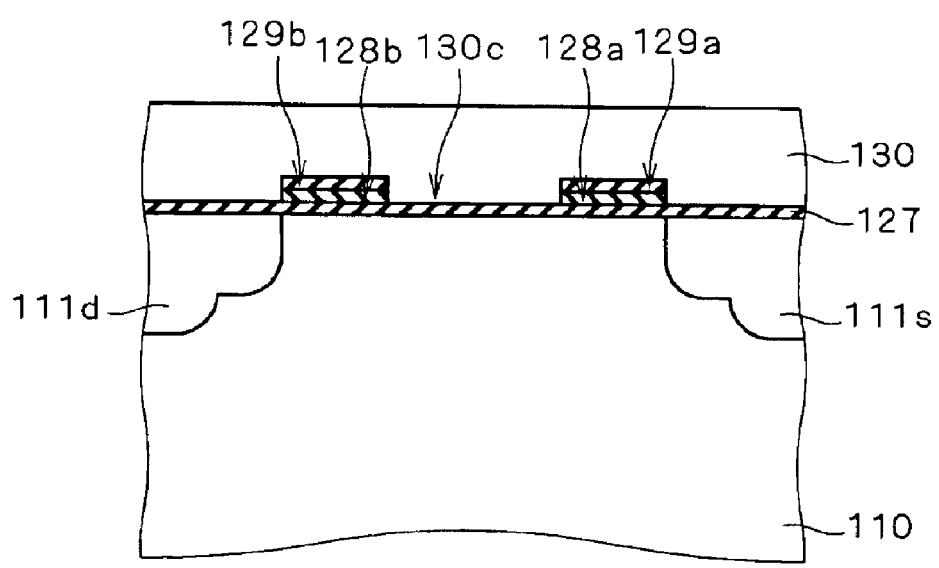
FIGS. 44 and 45 are views showing another example of the semiconductor device according to the fourteenth embodiment.
Figure 45:
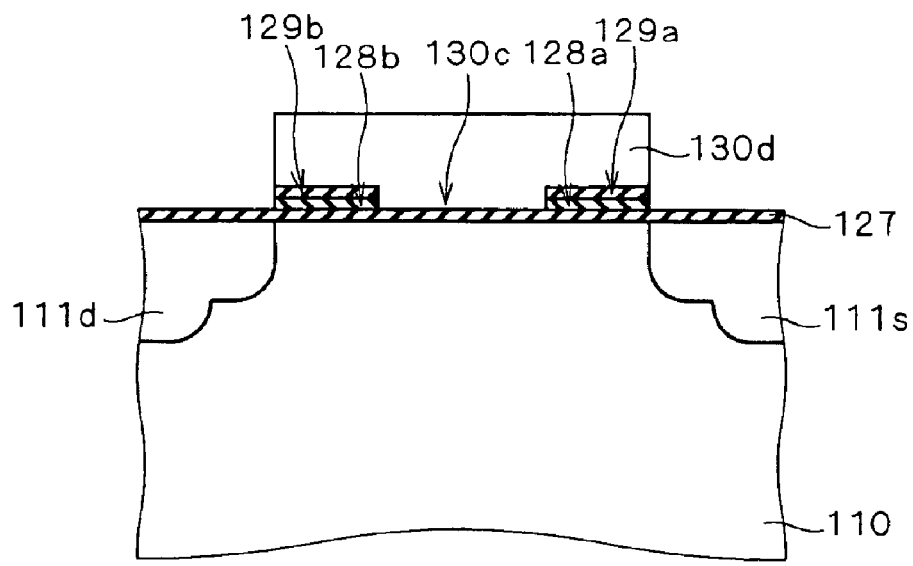

In place of the structure of FIG. 41, moreover, a structure shown in FIG. 44 or FIG. 45 may be employed. In both of the drawings, the first and second electric charge holding portions 128b and 128a have ends on the drain region 111d and the source region 111s, respectively. In FIG. 45, a shape 130d terminated on the source region 111s and the drain region 111d is also employed for a gate electrode.

In the same manner as the semiconductor device according to the eighth embodiment, accordingly, the MONOS transistor according to the present embodiment is formed continuously as a plurality of memory cells and the first and second electric charge holding portions 128b and 128a are insulated for each memory cell even if the gate insulating film is shared by adjacent transistors. Accordingly, the electric charge is not moved between the memory cells.

<Fifteenth Embodiment>

The present embodiment is a variant of the semiconductor device according to the fourteenth embodiment, in which an insulating film is formed between ends opposed to each other in first and second electric charge holding portions 128b and 128a and a gate electrode 130.

Figure 46:
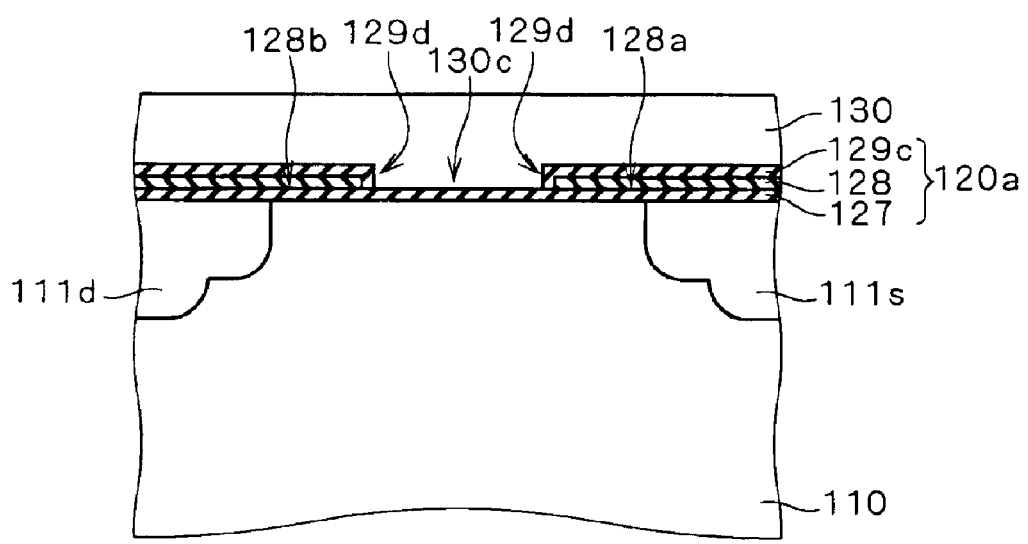
FIG. 46 is a view showing a semiconductor device according to a fifteenth embodiment.

FIG. 46 is a view showing a semiconductor device according to the present embodiment. In the semiconductor device, as shown in FIG. 46, the silicon oxide film 129 in the structure of FIG. 41 is replaced with a silicon oxide film 129c covering portions of the first and second electric charge holding portions 128b and 128a which face the gate electrode 130. More specifically, ends 129d of the silicon oxide film 129c cover terminal ends on the channel side in the first and second electric charge holding portions 128b and 128a. Other structures are the same as those of the semiconductor device according to the fourteenth embodiment.

Thus, if the portions of the first and second electric charge holding portions 128b and 128a which face the gate electrode 130 are covered with the silicon oxide film 129c, electric charges held in the first and second electric charge holding portions 128b and 128a can be prevented from being moved into the gate electrode 130.

Figure 47:
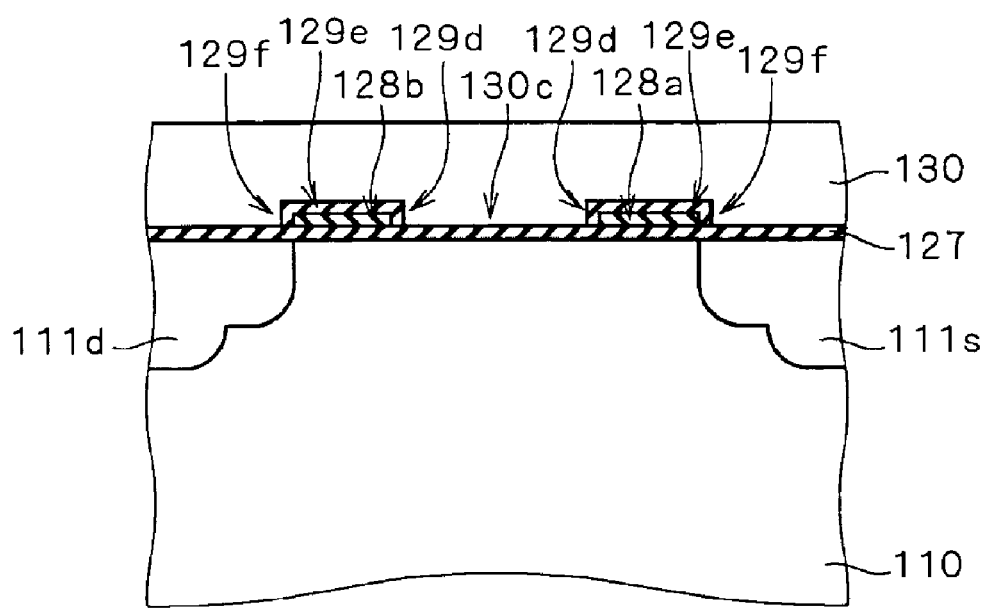
FIGS. 47 and 48 are views showing another example of the semiconductor device according to the fifteenth embodiment.
Figure 48:
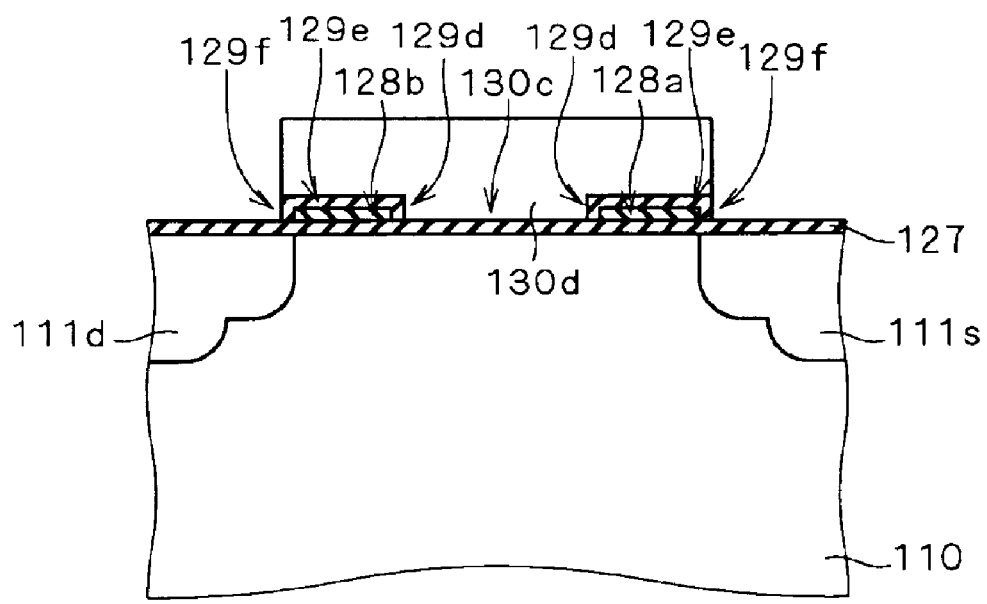

FIGS. 47 and 48 apply the silicon oxide film 129c to the structures of FIGS. 44 and 45. In both of FIGS. 47 and 48, the end 129d of a silicon oxide film 129e covers the ends on the channel side in the first and second electric charge holding portions 128b and 128a, and an end 129f of the silicon oxide film 129e also covers ends on the source/drain side in the first and second electric charge holding portions 128b and 128a. Other structures are the same as those of FIGS. 44 and 45.

Thus, if the ends on the source/drain side in the first and second electric charge holding portions 128b and 128a are also covered with the silicon oxide film 129e, the electric charges held in the first and second electric charge holding portions 128b and 128a can be prevented from being moved into the gate electrode 130 also in the case in which the gate electrode 130 is extended up to the ends of the first and second electric charge holding portions 128b and 128a.

<Sixteenth Embodiment>

The present embodiment is also a variant of the semiconductor device according to the fourteenth embodiment, in which a lamination structure including a silicon nitride film is not employed for first and second electric charge holding portions of a gate insulating film but an insulating film having a plurality of dots to be insular regions formed of silicon is employed.

Figure 49:
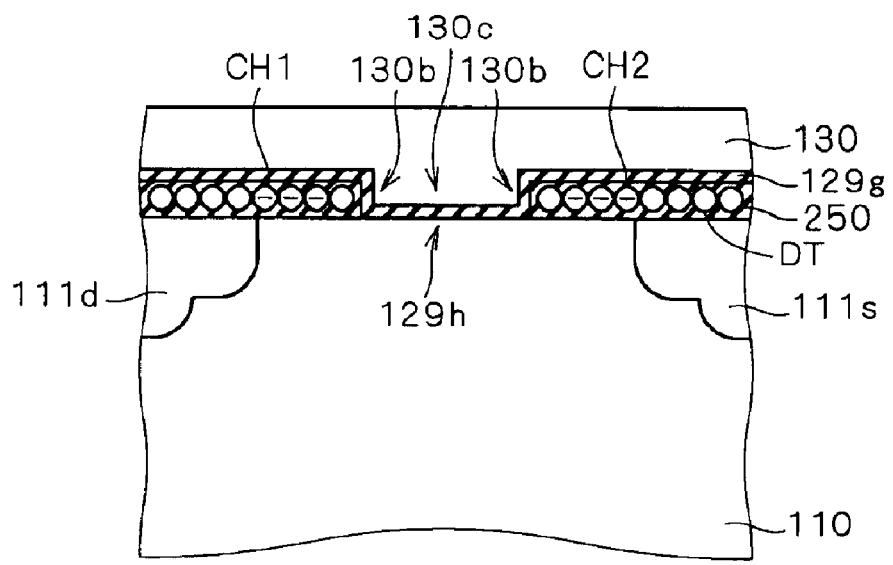
FIG. 49 is a view showing a semiconductor device according to a sixteenth embodiment.

FIG. 49 is a view showing an MIS transistor provided in a semiconductor device according to the present embodiment. In FIG. 49, an insulating film including a silicon dot DT (for example, a silicon oxide film) 250 is formed as first and second electric charge holding portions on a semiconductor substrate 110. The insulating film 250 is disconnected on a central part of a channel. More specifically, in the present embodiment, the insulating films 250 opposed to each other in such a direction as to connect a source region 111s and a drain region 111d apart from each other function as the first and second electric charge holding portions capable of holding electric charges CH1 and CH2.

A silicon oxide film 129g is further formed to cover a surface of the central part of the channel in the semiconductor substrate 110 and the insulating film 250. Since the insulating film 250 is disconnected, a gate insulating film provided on the central part of the channel is constituted by only a portion 129h of the silicon oxide film 129g which is provided on the channel. On the other hand, the gate insulating film in portions in which the first and second electric charge holding portions are formed is constituted by a lamination structure including the insulating film 250 and the silicon oxide film 129g. A thickness of the silicon oxide film 129g is set to be smaller than that of the insulating film 250 to be the first and second electric charge holding portions.

Accordingly, a thickness of the gate insulating film on the central part of the channel, that is, a portion interposed between the insulating films 250 to be the first and second electric charge holding portions is smaller than that of the gate insulating film in a laminated film portion in which the first and second electric charge holding portions are formed. Moreover, a portion 130c of the gate electrode 130 above the central part of the channel is provided between the insulating films 250 to be the first and second electric charge holding portions.

The semiconductor device has the same structure as the structure of the semiconductor device according to the fourteenth embodiment except that the gate insulating film is replaced with the insulating film 250 and the silicon oxide film 129g. In the same manner as described in the twelfth embodiment, it is possible to produce an advantage by employing the silicon dot DT. Moreover, a dot-shaped silicon nitride film may be employed in place of the silicon dot.

Thus, the first and second electric charge holding portions are constituted by a plurality of dots formed in the gate insulating film so that the held electric charges are moved with more difficulty and a semiconductor device having a more excellent nonvolatile property can be implemented as compared with the case in which the first and second electric charge holding portions are constituted by a film provided continuously in the gate insulating film such as a silicon nitride film 128.

In the case in which a silicon oxide film is used for the gate insulating film, for example, an energy level in the dot of the silicon or the silicon nitride film is more stabilized than that of the silicon oxide film. If the dot is constituted by the silicon or the silicon nitride film, accordingly, the movement of the held electric charges is caused with difficulty and a semiconductor device having an excellent nonvolatile property can be implemented.

<Seventeenth Embodiment>

The present embodiment is an example of a method of manufacturing the semiconductor device according to the fourteenth embodiment.

Figure 50:
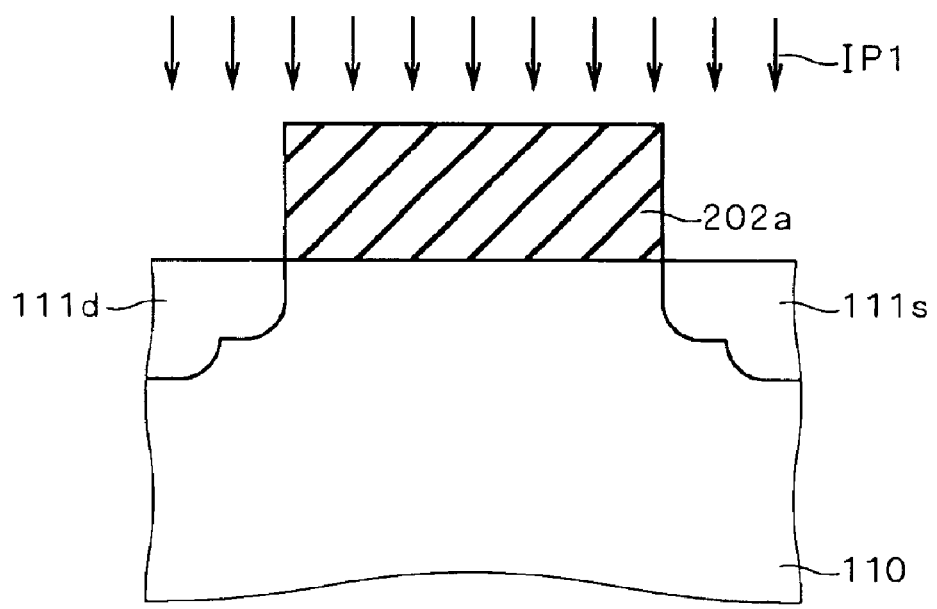
FIGS. 50 to 53 are views showing a method of manufacturing a semiconductor device according to a seventeenth embodiment.

First of all, a well is formed and channel doping is carried out in a semiconductor substrate 110. As shown in FIG. 50, next, a mask 202a such as a photoresist is formed and a source region 111s and a drain region 111d are formed in positions facing a surface in the semiconductor substrate 110 by an impurity implantation IP1. At this time, it is preferable that an impurity concentration of the impurity implantation IP1 should be set to be approximately $1 \times 10^{14}$ to $1 \times 10^{15}$ [/cm$^2$]. Moreover, it is preferable that a distance between the source region 111s and the drain region 111d, that is, a channel length should be set to be approximately 0.1 to 0.3 μm.

Figure 51:
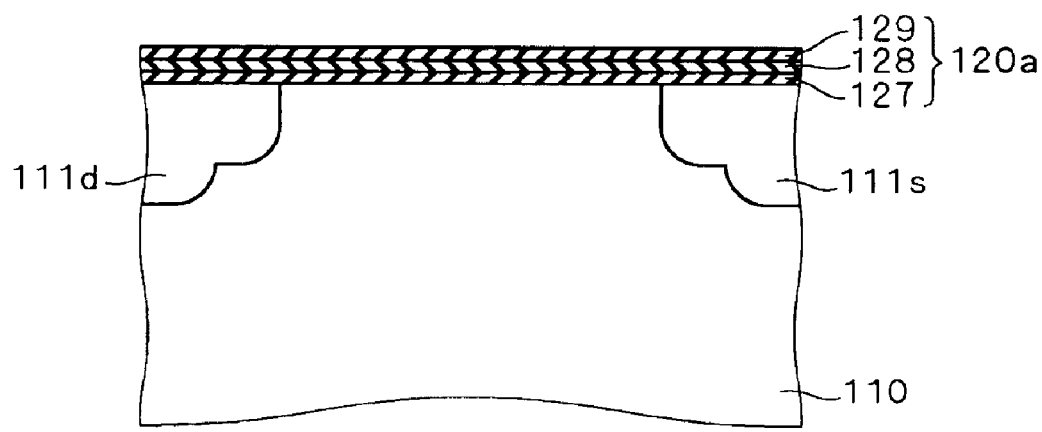

After the mask 202a is removed, a gate insulating film 120a is formed on the semiconductor substrate 110 (FIG. 51). More specifically, a silicon oxide film 127, a silicon nitride film 128 and a silicon oxide film 129 which constitute the gate insulating film 120a are formed in this order by CVD, for example. It is preferable that the silicon oxide film 127 should have a thickness of approximately 2.5 to 6.0 nm, the silicon nitride film 128 should have a thickness of approximately 6.0 nm and the silicon oxide film 129 should have a thickness of approximately 3.0 nm, for example.

Figure 52:
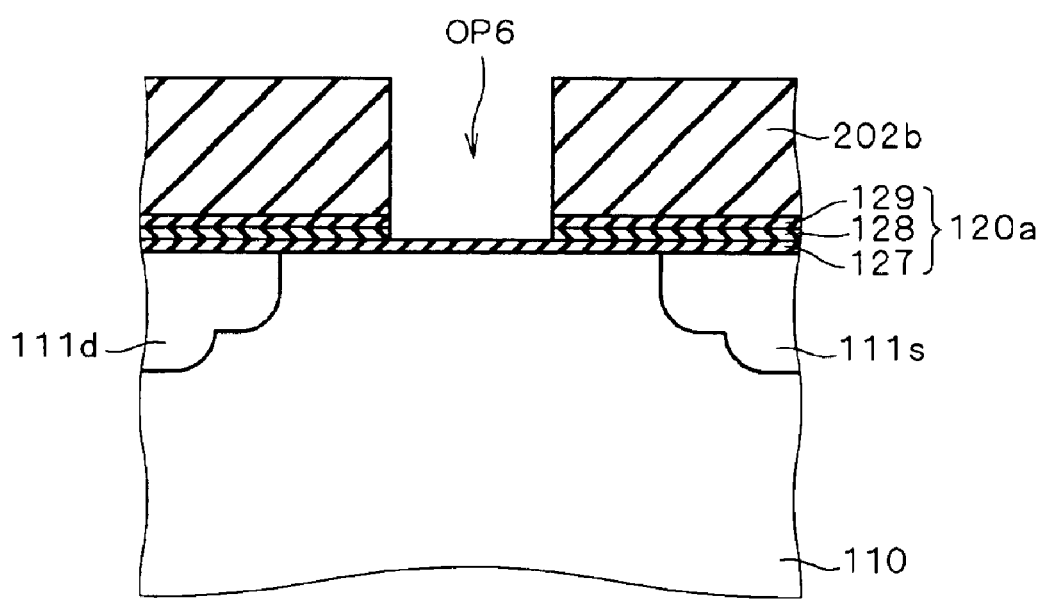

Subsequently, a mask 202b such as a photoresist is formed on the silicon oxide film 129 and an opening OP6 is provided above a central part of a channel. By using the mask 202b, the silicon oxide film 129 and the silicon nitride film 128 are subjected to patterning by a photolithographic technique and an etching technique (FIG. 52). Then, the mask 202b is removed and a conductive film such as polysilicon is formed on the silicon oxide films 127 and 129 by the CVD so that a gate electrode 130 is provided. Thus, the MONOS transistor described in the fourteenth embodiment is finished.

Figure 53:
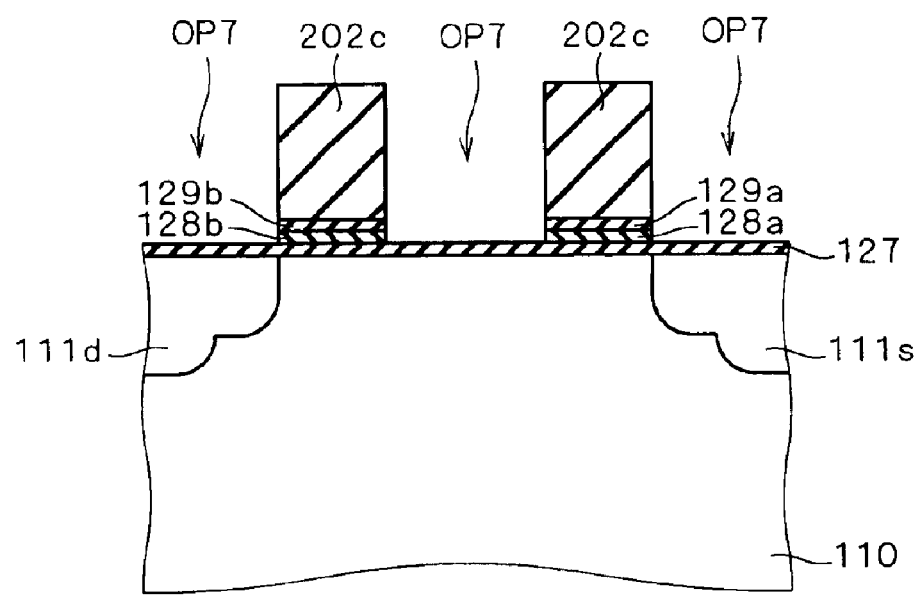

In the case in which the structure shown in FIG. 44 or 45 is to be obtained, it is preferable that a shape of a mask 202c having an opening OP7 should be employed in place of the mask 202b as shown in FIG. 53.

While the case in which the photoresist is employed as the mask has been described above, it is also possible to employ, for the mask, a silicon oxide film, a silicon nitride film, polysilicon or the like which is a material capable of maintaining an etching selectivity ratio to a material of lower layer or a material exposed therearound.

<Eighteenth Embodiment>

The present embodiment is an example of a method of manufacturing the semiconductor device according to the fifteenth embodiment.

In the same manner as in the seventeenth embodiment, first of all, a source region 111s and a drain region 111d are formed in a semiconductor substrate 110 and a gate insulating film 120a is formed on the semiconductor substrate 110. Then, a silicon oxide film 129 and a silicon nitride film 128 are subjected to patterning and an insulating film for covering a terminal portion on the channel side of the silicon nitride film 128 is then formed by thermal oxidation so as to be ends 129d of a silicon oxide film 129c (FIG. 54).

Figure 55:
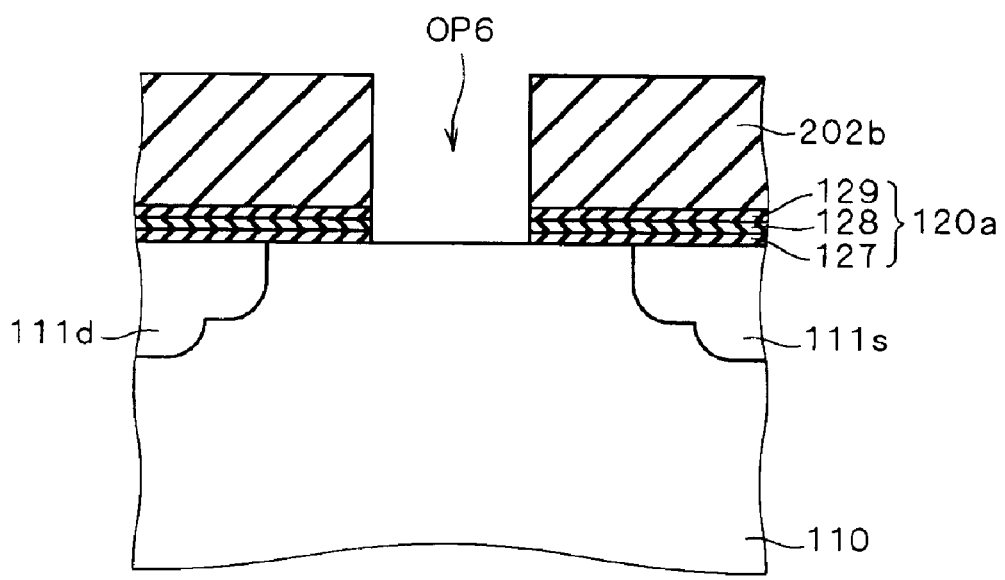
Figure 56:
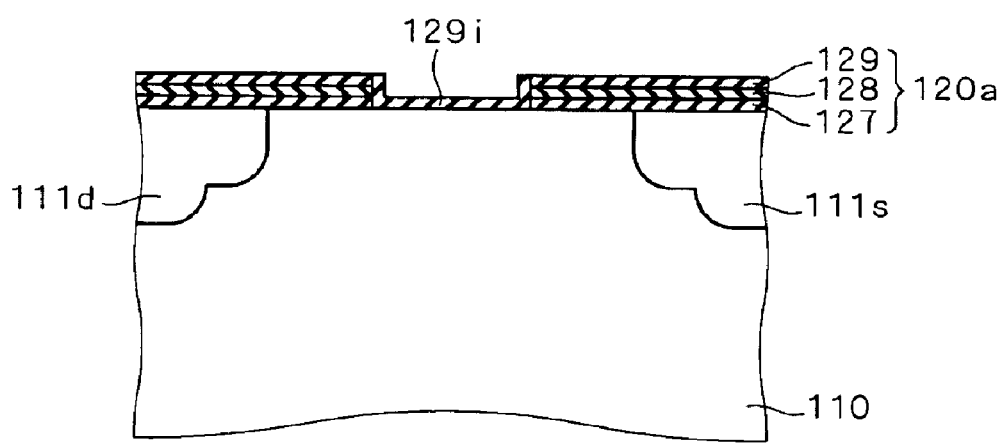

In addition, the structure of the semiconductor device according to the fifteenth embodiment is preferably manufactured in the following manner, for example. More specifically, as shown in FIG. 55, etching is carried out up to a silicon oxide film 127 to be a lower layer in a patterning processing of FIG. 52. As shown in FIG. 56, then, terminal portions on the channel side of the semiconductor substrate 110 and the silicon nitride film 128 in an exposed channel portion are thermally oxidized to form a silicon oxide film 129i.

Figure 54:
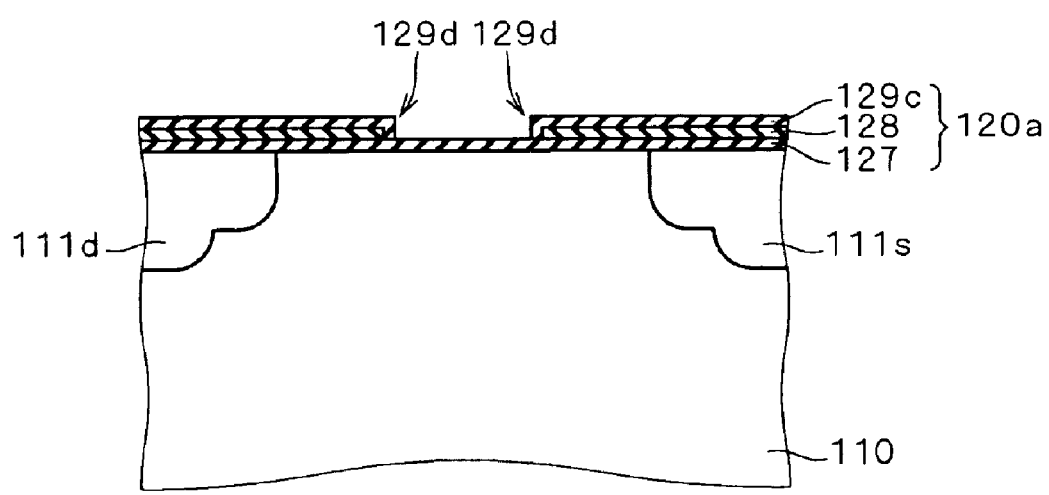
FIGS. 54 to 57 are views showing a method of manufacturing a semiconductor device according to an eighteenth embodiment.
Figure 57:
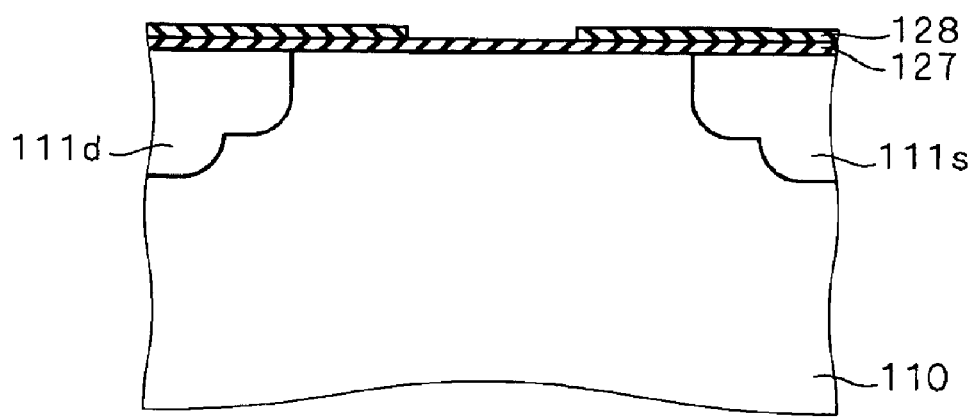

As shown in FIG. 57, alternatively, it is also possible to manufacture the structure of FIG. 54 by forming the silicon oxide film 127 and the silicon nitride film 128 on the semiconductor substrate 110 and then carrying out the patterning processing of FIG. 52 to pattern only the silicon nitride film 128, and thereafter thermally oxidizing a surface of the silicon nitride film 128 and ends on the channel side.

<Nineteenth Embodiment>

The present embodiment is an example of a method of manufacturing the semiconductor device according to the sixteenth embodiment.

In the same manner as in FIG. 50, first of all, a source region 111s and a drain region 111d are formed in a semiconductor substrate 110. Then, an insulating film 250 to be a silicon oxide film including a silicon dot DT is formed on the semiconductor substrate 110 by using a technique described in the Non-Patent Document 5, for example.

Figure 58:
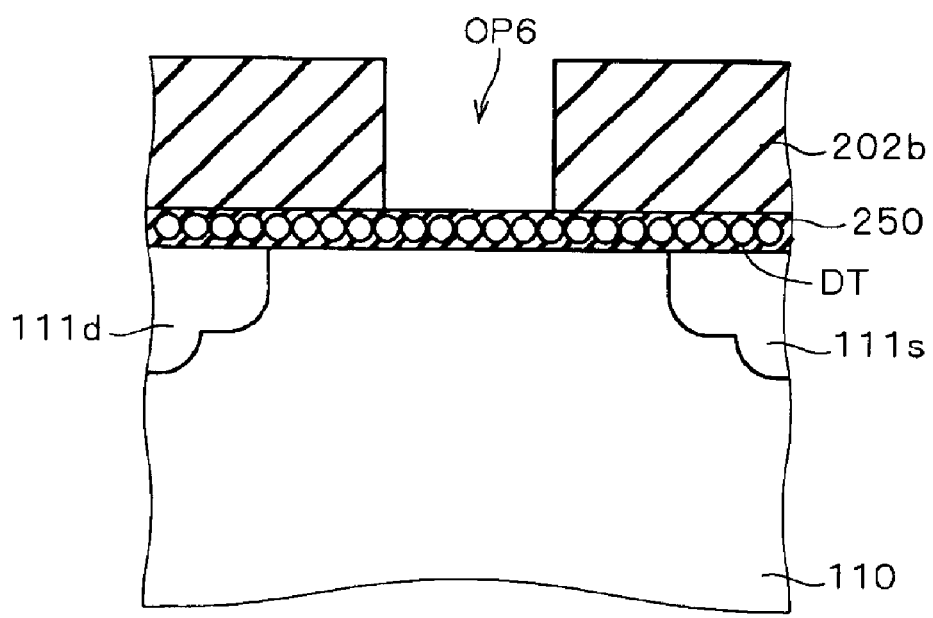
FIGS. 58 and 59 are views showing a method of manufacturing a semiconductor device according to a nineteenth embodiment.
Figure 59:
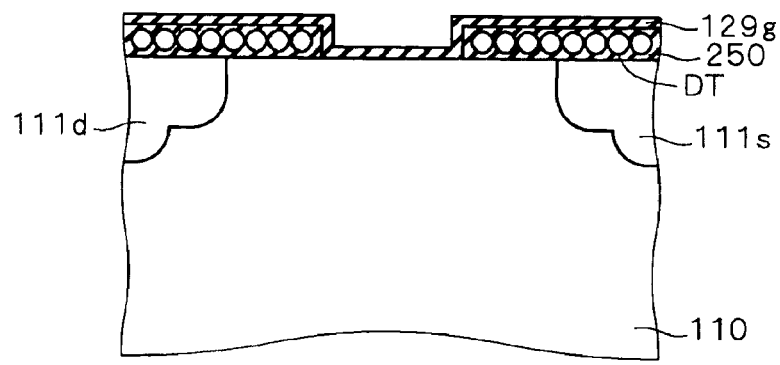

As shown in FIG. 58, next, a mask 202b such as a photoresist is formed on the insulating film 250 and an opening OP6 is provided above a central part of a channel. By using the mask 202b, the insulating film 250 is subjected to patterning by a photolithographic technique and an etching technique. Thereafter, the mask 202b is removed and a silicon oxide film 129g is formed on the insulating film 250 and the semiconductor substrate 110 on an exposed channel portion as shown in FIG. 59.

Subsequently, a conductive film such as polysilicon is formed on the silicon oxide film 129g by CVD or the like and a gate electrode 130 is provided. Thus, the MONOS transistor according to the sixteenth embodiment is finished.

In the case in which a dot-shaped silicon nitride film is employed in place of the silicon dot, it is preferable that a technique described in the Patent Document 3 should be used, for example.

<Twentieth Embodiment>

The present embodiment is a variant of the semiconductor device according to the first embodiment, in which first and second electric charge holding portions are formed in a gate insulating film provided adjacently to a side surface of a trench.

Figure 60:
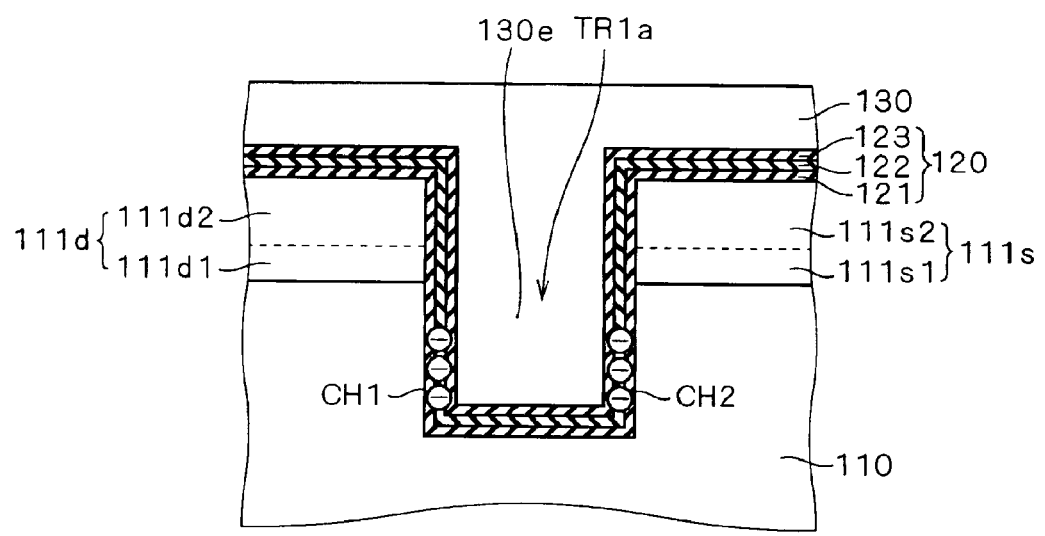
FIG. 60 is a view showing a semiconductor device according to a twentieth embodiment.

FIG. 60 is a view showing an MONOS transistor provided in the semiconductor device according to the present embodiment. As shown in FIG. 60, in the MONOS transistor, a trench TR1a is formed much more deeply than a source region 111s and a drain region 111d, and the source region 111s and the drain region 111d are formed adjacently to the trench TR1a.

The inner part side of a semiconductor substrate 110 in the source region 111s and the drain region 111d forms LDD regions 111s1 and 111d1 having comparatively low impurity concentrations, and the surface side of the semiconductor substrate 110 forms high concentration regions 111s2 and 111d2 having comparatively high impurity concentrations.

First and second electric charge holding portions capable of holding electric charges CH1 and CH2 are formed in a gate insulating film 120 which is adjacent to a portion of a side surface of the trench TR1a which is deeper than the source region 111s and the drain region 111d.

In the case in which a program operation and an erase operation are carried out for a memory cell over the MONOS transistor, it is preferable that proper voltages should be applied to the semiconductor substrate 110, a gate electrode 130, the source region 111s and the drain region 111d, respectively, in the same manner as in the first embodiment.

The source region 111s and the drain region 111d are formed adjacently to the trench TR1a. Therefore, positions of the first and second electric charge holding portions are set into portions of the gate insulating film 120 which are deeper than the source region 111s and the drain region 111d as shown in FIG. 60.

Also in this case, in the same manner as in the first embodiment, when the electric charge CH1 is trapped into the first electric charge holding portion and the electric charge CH2 is then trapped into the second electric charge holding portion, a portion 130e of a gate electrode in the trench TR1a functions as a shield. Moreover, the deep trench TR1a is formed between the source region 111s and the drain region 111d. Therefore, an effective channel length is increased and a resistance to a punch-through is also enhanced.

In the present embodiment, the first and second electric charge holding portions are provided in the gate insulating film 120 which is adjacent to the side surface of the trench TR1a. Therefore, it is possible to form the source region 111s and the drain region 111d adjacently to the trench TR1a. Thus, a distance between the source and the drain can be reduced in a plane view of the surface of the semiconductor substrate 110.

More specifically, a length of the MONOS transistor in a direction of a gate length can be reduced in the plane view of the surface of the semiconductor substrate 110. Consequently, it is possible to increase the number of elements which can be formed on the surface of the semiconductor substrate 110, thereby enhancing a degree of integration.

In order to form the structure in FIG. 60, the following method is preferably employed. More specifically, a low concentration region having a comparatively low impurity concentration is first formed on the surface of the semiconductor substrate 110 by an ion implantation. Subsequently, a high concentration region which is shallower than the low concentration region and has a comparatively high impurity concentration is formed. It is preferable that the low concentration region and the high concentration region should be subjected to an annealing processing if necessary.

Next, the trench TR1a is formed by using a photolithographic technique and an etching technique in order to divide the low concentration region and the high concentration region. The low concentration region and the high concentration region on both sides which are divided by the trench TR1a act as the source region 111s and the drain region 111d.

Subsequently, a silicon oxide film 121 is formed on the semiconductor substrate 110 by thermal oxidation, CVD or the like. Then, a silicon nitride film 122 is formed on the silicon oxide film 121 by the CVD or the like. Thereafter, a silicon oxide film 123 is formed on the silicon nitride film 122 by the thermal oxidation, the CVD or the like. Thus, the gate insulating film 120 having an ONO structure is finished.

Then, the gate electrode 130 is formed on the silicon oxide film 123. Thus, the structure in FIG. 60 can be obtained.

Figure 61:
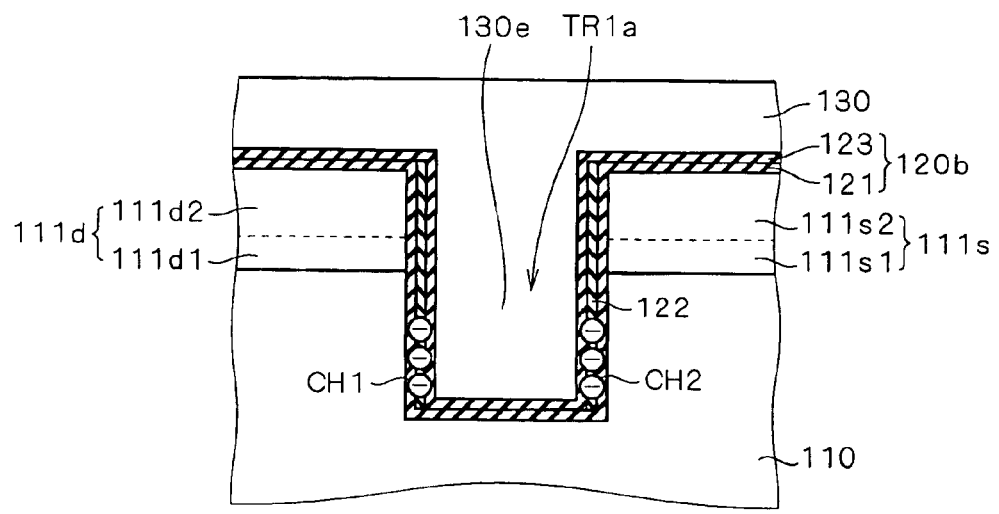
FIG. 61 is a view showing another example of the semiconductor device according to the twentieth embodiment.

FIG. 61 is a view showing another example of the MONOS transistor provided in the semiconductor device according to the present embodiment. As shown in FIG. 61, the MONOS transistor has an ONO structure including the silicon oxide film 121, the silicon nitride film 122 and the silicon oxide film 123 in only the side surface portion of the trench TR1a, and the silicon nitride film 122 is not formed on a surface of the semiconductor substrate 110 and a bottom surface of the trench TR1a. Others are the same as in the structure of FIG. 60.

Also in this case, in the same manner as in the semiconductor device of FIG. 60, when the electric charge CH1 is trapped into the first electric charge holding portion and the electric charge CH2 is then trapped into the second electric charge holding portion, the portion 130e of the gate electrode in the trench TR1a functions as a shield. Moreover, the deep trench TR1a is formed between the source region 111s and the drain region 111d. Therefore, an effective channel length is increased and a resistance to a punch-through is also enhanced. A length of the MONOS transistor in the direction of the gate length can be reduced in the plane view of the surface of the semiconductor substrate 110. Consequently, it is possible to increase the number of elements which can be formed on the surface of the semiconductor substrate 110, thereby enhancing a degree of integration.

In order to form the structure in FIG. 61, the following method is preferably employed. More specifically, the trench TR1a, the source region 111s, the drain region 111d, the silicon oxide film 121 and the silicon nitride film 122 are provided in the same manner as in the case in which the structure of FIG. 60 is to be formed.

Next, anisotropic etch back is carried out over the silicon nitride film 122 so that the silicon nitride film 122 provided on the surface of the semiconductor substrate 110 and the bottom surface of the trench TR1a is removed. Consequently, the silicon nitride film 122 remains on only the side surface of the trench TR1a.

Then, the silicon oxide film 123 is formed on the silicon oxide film 121 and the silicon nitride film 122 by the thermal oxidation, the CVD or the like. Thus, a gate insulating film 120b is finished. Thereafter, the gate electrode 130 is formed on the silicon oxide film 123. Consequently, the structure in FIG. 61 can be obtained.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device, comprising:
   a semiconductor substrate having a trench formed in a surface of said semiconductor substrate; and
   an MIS (Metal Insulator Semiconductor) transistor including (1) a source region formed to face said surface in said semiconductor substrate, (2) a drain region formed to face said surface in said semiconductor substrate, said drain region formed apart from said source region on an opposite side of said trench, (3) a gate insulating film formed on at least a portion of said surface which is interposed between said source region and said drain region within said trench, and (4) a gate electrode formed on said gate insulating film at least within said trench,
   wherein first and second electric charge holding portions configured to hold an electric charge are formed in said gate insulating film with said trench interposed therebetween.

2. The semiconductor device according to claim 1,
wherein said gate insulating film is a laminated film in which a first silicon oxide film, a silicon nitride film, and a second silicon oxide film are sequentially provided; and said first and second electric charge holding portions are first and second portions in said silicon nitride film with said trench interposed therebetween, and are opposed to each other.

3. The semiconductor device according to claim 1,
wherein said first and second electric charge holding portions are not formed in a portion of said gate insulating film within said trench.

4. Then semiconductor device according to claim 1,
wherein another MIS transistor having another source region, another drain region, another gate insulating film and another gate electrode is also formed on said semiconductor substrate.

5. The semiconductor device according to claim 4,
wherein said first and second electric charge holding portions are not formed in a portion of said gate insulating film which enters said trench and said another gate insulating film of said another MIS transistor is extended in said portion of said gate insulating film which enters said trench.

6. The semiconductor device according to claim 1,
wherein said first and second electric charge holding portions have ends on said source region and said drain region.

7. The semiconductor device according to claim 6,
wherein insulating films for covering said ends of said first and second electric charge holding portions are formed on said ends, respectively.

8. The semiconductor device according to claim 1,
wherein corner portions of an upper end and a bottom in said trench are rounded.

9. The semiconductor device according to claim 1,
wherein said first and second electric charge holding portions are formed by a plurality of insular regions formed in said gate insulating film.

10. The semiconductor device according to claim 9,
wherein said insular regions are constituted by silicon or a silicon nitride film.

11. The semiconductor device according to claim 1,
wherein said first and second electric charge holding portions are formed in said gate insulating film which is adjacent to a side surface of said trench.

* * * * *